United States Patent
Lu

(10) Patent No.: US 11,430,708 B2
(45) Date of Patent: Aug. 30, 2022

(54) PACKAGE STRUCTURE AND CIRCUIT LAYER STRUCTURE INCLUDING DUMMY TRACE AND MANUFACTURING METHOD THEREFOR

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/092,193

(22) Filed: Nov. 6, 2020

(65) Prior Publication Data

US 2022/0148936 A1    May 12, 2022

(51) Int. Cl.
   *H01L 23/31*   (2006.01)
(52) U.S. Cl.
   CPC ...... *H01L 23/3121* (2013.01); *H01L 23/3114* (2013.01)
(58) Field of Classification Search
   CPC .................. H01L 23/522; H01L 23/585; H01L 23/53295; H01L 23/562; H01L 23/3121; H01L 23/3144
   See application file for complete search history.

(56) References Cited

U.S. PATENT DOCUMENTS

| | | | |
|---|---|---|---|
| 2006/0103017 A1* | 5/2006 | Usui ................... | H01L 23/5329 257/725 |
| 2006/0166434 A1* | 7/2006 | Kinoshita ............ | H01L 23/522 438/253 |
| 2013/0221493 A1* | 8/2013 | Kim .................... | H01L 23/3128 257/620 |
| 2018/0025986 A1* | 1/2018 | Chiu ................... | H01L 23/3114 257/531 |
| 2018/0138151 A1* | 5/2018 | Shih ....................... | H01L 24/94 |
| 2020/0020628 A1* | 1/2020 | Huang ................ | H01L 23/5381 |
| 2020/0126899 A1* | 4/2020 | Lee .................... | H01L 23/49827 |
| 2020/0203300 A1* | 6/2020 | Huang ............... | H01L 23/49838 |
| 2020/0381362 A1* | 12/2020 | Tseng ................ | H01L 25/0657 |
| 2021/0305112 A1* | 9/2021 | Tseng ................. | H01L 23/3114 |
| 2021/0375810 A1* | 12/2021 | Kim ....................... | H01L 24/14 |

* cited by examiner

Primary Examiner — Jaehwan Oh
Assistant Examiner — John M Parker
(74) Attorney, Agent, or Firm — Foley & Lardner LLP

(57) ABSTRACT

A package structure and a circuit layer structure are provided in the present disclosure. The package structure includes a wiring structure, a first electronic device, a second electronic device and at least one dummy trace. The wiring structure includes a plurality of interconnection traces. The first electronic device and the second electronic device are disposed on the wiring structure, and electrically connected to each other through the interconnection traces. The dummy trace is adjacent to the interconnection traces. A mechanical strength of the at least one dummy trace is less than a mechanical strength of one of the interconnection traces.

17 Claims, 23 Drawing Sheets

PACKAGE STRUCTURE AND CIRCUIT LAYER STRUCTURE INCLUDING DUMMY TRACE AND MANUFACTURING METHOD THEREFOR

BACKGROUND

1. Technical Field

The present disclosure relates to a semiconductor package and a circuit layer structure including a dummy trace and a manufacturing method therefor.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semiconductor package structure may occur during the thermal process due to coefficients of thermal expansion (CTE) mis-matches among different materials used in the semiconductor package structure. Since the stress would be concentrated near the corners of the electronic devices in the semiconductor package, a crack may be formed near the corners of the electronic devices and extend or grow further into the interior of the semiconductor package structure. If the crack reaches the wiring structure of the semiconductor package structure, the circuit layer in the semiconductor package structure may be damaged or broken, which may result in an open circuit and render the semiconductor package structure inoperative. Thus, a yield of the semiconductor assembly structure may decrease.

SUMMARY

In an aspect, a package structure is provided. The package structure includes a wiring structure, a first electronic device, a second electronic device and at least one dummy trace. The wiring structure includes a plurality of interconnection traces. The first electronic device and the second electronic device are disposed on the wiring structure, and electrically connected to each other through the interconnection traces. The dummy trace is adjacent to the interconnection traces. A mechanical strength of the at least one dummy trace is less than a mechanical strength of one of the interconnection traces.

In an aspect, a circuit layer structure is provided. The circuit layer structure includes a wiring structure and at least one dummy trace. The wiring structure includes a plurality of interconnection traces. The dummy trace is disposed adjacent to the interconnection traces. A mechanical strength of a first portion of the at least one dummy trace is less than a mechanical strength of a second portion of the at least one dummy trace.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

DETAILED DESCRIPTION

Figure 1A:
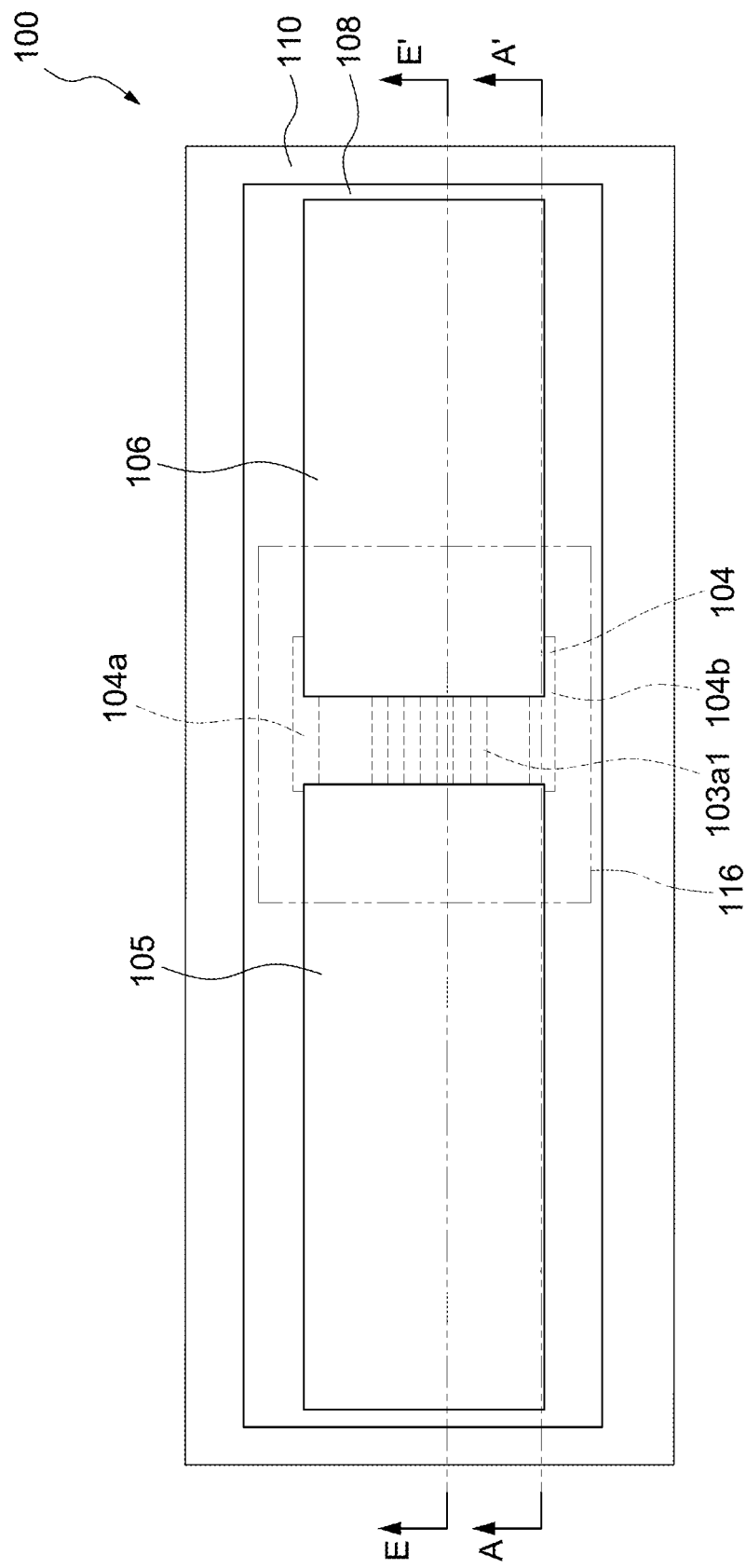
FIG. 1A illustrates a schematic top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "top," "bottom," "higher," "lower," "under," and so forth, are indicated with respect to the orientation shown in the figures unless otherwise specified. It should be understood that the spatial descriptions used herein are for purpose of illustration only, and that practical implementations of the structures described herein can be spatially arranged in any orientation or manner, provided that the merits of embodiments of this disclosure are not deviated by such arrangement. As used herein, the singular terms "a," "an," and "the" may include plural referents unless the context clearly dictates otherwise.

Figure 1B:
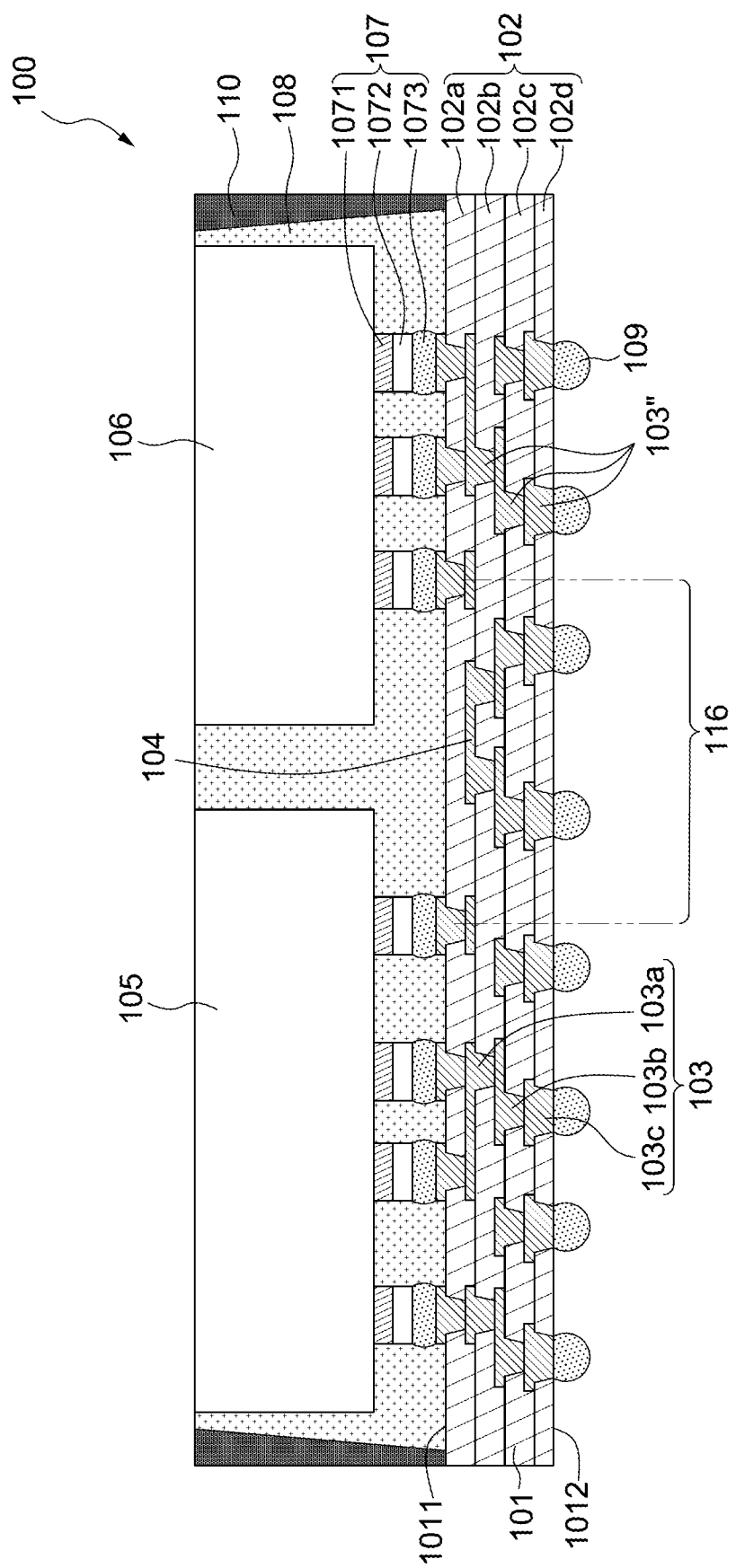
FIG. 1B illustrates a schematic cross-sectional view taken along line A-A' of a package structure of FIG. 1A.
Figure 1C:
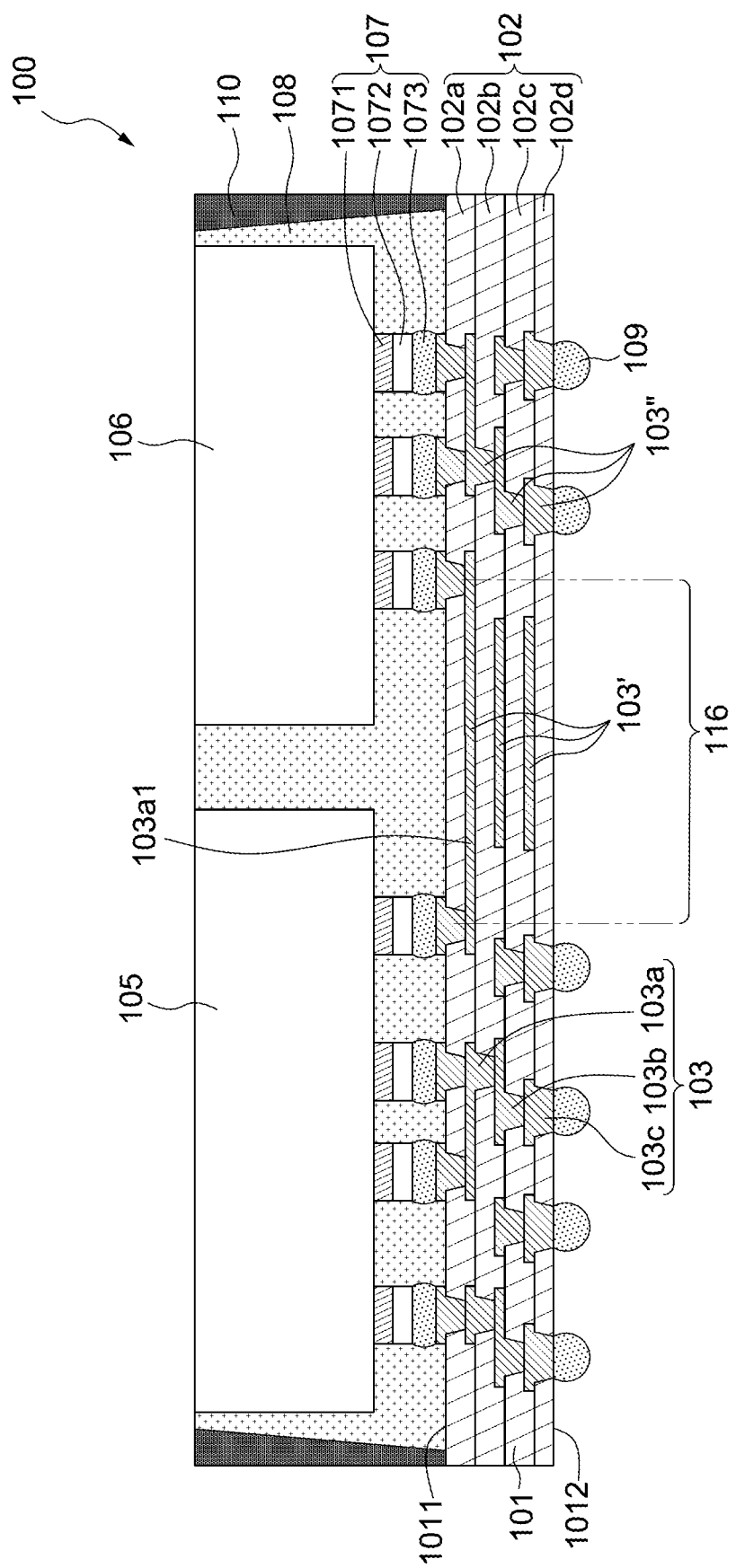
FIG. 1C illustrates a schematic cross-sectional view along line E-E' of a package structure of FIG. 1A

FIG. 1A illustrates a schematic top view of a package structure 100 according to some embodiments of the present disclosure. FIG. 1B illustrates a schematic cross-sectional view taken along line A-A' of the package structure 100 of FIG. 1A. FIG. 1C illustrates a schematic cross-sectional view taken along line E-E' of the package structure 100 of FIG. 1A.

As shown in FIGS. 1A and 1B, the package structure 100 includes a wiring structure 101, at least one dummy trace 104, a first electronic device 105, a second electronic device 106, a plurality of bonding structures 107, an underfill material 108, an encapsulant material 110, and a plurality of solder balls 109. The wiring structure 101 may be a redistribution structure. The wiring structure 101 includes at least one dielectric layer 102 and at least one circuit layer 103. As shown in FIG. 1B, the at least one dielectric layer 102 includes a plurality of dielectric layers 102a, 102b, 102c, and 102d, and the at least one circuit layer 103 includes a plurality of circuit layers 103a, 103b, and 103c. The circuit layer 103 may be a redistribution layer (RDL). As shown in FIG. 1B, according to some embodiments of the present disclosure, the bonding structure 107 may include a plurality of electrical contacts 1071 respectively connecting to the first electronic device 105 and the second electronic device 106, a plurality of bumps 1072, and a plurality of solder materials 1073.

According to some embodiments of the present disclosure, the material of the at least one dielectric layer 102 may include an insulating material, a passivation material, a dielectric material or a solder resist material, such as, for example, a benzocyclobutene (BCB) based polymer or a polyimide (PI). The material of the at least one circuit layer 103 may include, for example, copper, another conductive metal, or an alloy thereof. The material of the dummy trace 104 may include, for example, copper, another conductive metal, or an alloy thereof. The first electronic device 105 may include an application-specific integrated circuit (ASIC) device. The second electronic device 106 may include a high bandwidth memory (HBM) device. However, the amounts of the first electronic device(s) 105 and the second electronic device(s) 106 are not limited in the present disclosure. The material of the plurality of bonding bumps 1072 may include, for example, copper, another conductive metal, or an alloy thereof.

As shown in FIG. 1B, the wiring structure 101 has a first surface 1011 and a second surface 1012 opposite to the first surface 1011. The first electronic device 105 and the second electronic device 106 are mounted on the first surface 1011 of the wiring structure 101 through the plurality of bonding structures 107. That is, the first electronic device 105 and the second electronic device 106 are electrically connected to the first surface 1011 of the wiring structure 101 through flip-chip bonding. The underfill material 108 is disposed between the first electronic device 105 and the wiring structure 101, and/or between the second electronic device 106 and the wiring structure 101. In some embodiments, the underfill material 108 may contact the at least one dummy trace 104 and one of the circuit layers 103. According to some embodiments of the present disclosure, the top surface of the underfill material 108 is coplanar with the top surface (e.g., backside surface) of the electronic device 105 and the top surface (e.g., backside surface) of the second electronic device 106. According to some embodiments of the present disclosure, the solder balls 109 are formed on the second surface 1012 of the wiring structure 101 and are in contact with the at least one circuit layer 103. The solder balls 109 may be used for external connection. The encapsulant material 110 is formed on the wiring structure 101 and encapsulates the underfill material 108. According to some embodiments of the present disclosure, encapsulant material 110 is coplanar with the top surface of each of electronic device 105 and the second electronic device 106.

As illustrated in FIGS. 1A, 1B and 1C, the at least one circuit layer 103 includes first trace portions 103' and second trace portions 103". As shown in FIG. 1B and FIG. 1C, the at least one circuit layer 103 further includes circuit layers 103a, 103b and 103c. The circuit layers 103a is a topmost circuit layer that is nearest to the first electronic device 305 and/or the second electronic device 306. The interconnection traces 103a1 are the first trace portions 103' of the circuit layer 103a. In some embodiments, the at least one dummy trace 104 and the interconnection traces 103a1 are disposed at the same layer (i.e., the topmost circuit layer 103a). The first trace portions 103' are located in a high density region (or a fine line region) 116 between the electronic devices 105 and 106, and the second trace portions 103" are located outside the high density region 116 (e.g., a low density region). According to some embodiments of the present disclosure, the first trace portions 103' are between the first electronic device 105 and the second electronic device 106. More specifically, according to some embodiments of the present disclosure, the first trace portions 103' are between a first projection of the first electronic device 105 on the wiring structure 101 and a second projection of the second electronic device 106 on the wiring structure 101. According to some embodiments of the present disclosure, the electronic devices 105 and 106 may be electrically connected to each other through the interconnection traces 103a1. The electronic devices 105 and 106 may be electrically connected to the solder balls 109 on the second surface 1012 of the wiring structure 101 through the second trace portions 103" of the at least one circuit layer 103. A line width/line space (L/S) of the first trace portions 103' (the interconnection traces 103a1) may be less than an L/S of the traces of the second trace portions 103". For example, an L/S of the traces of the first trace portions 103' (the interconnection traces 103a1) may be less than or equal to about 5 µm/about 5 µm, or less than or equal to about 2 µm/about 2 µm, or less than or equal to about 0.8 µm/about 0.8 µm. An L/S of the traces of the second trace portions 103" may be less than or equal to about 10 µm/about 10 µm, or less than or equal to about 7 µm/about 7 µm, or less than or equal to about 5 µm/about 5 µm.

As shown in FIGS. 1A and 1B, the test structure 104 may include a first dummy trace 104a and an additional dummy trace 104b. According to some embodiments of the present disclosure, the test structure 104 may include only one dummy trace or more than three dummy traces. As shown in FIGS. 1A and 1B, the first dummy trace 104*a* and the additional dummy trace 104*b* are disposed on the wiring structure 101 and are adjacent to the interconnection traces 103*a*1. There may be no additional trace disposed between the test structure 104 and the interconnection traces 103*a*1. According to some embodiments of the present disclosure, the at least one dummy trace 104 and the interconnection traces 103*a*1 (e.g., the first trace portions 103') are formed concurrently through the same manufacturing process. According to some embodiments of the present disclosure, the dummy trace 104 and the interconnection traces 103*a*1 (e.g., the first trace portions 103') are formed by the same material.

The encapsulant 110 may cover at least a portion of the first surface 1011 of the wiring structure 101, at least a portion of the first electronic device 105, at least a portion of the second electronic device 106 and the underfill material 108. A material of the encapsulant 110 may be a molding compound with or without fillers. The top surface of the encapsulant 110 may be coplanar with the top surface of the underfill material 108, the top surface (e.g., backside surface) of the electronic device 105 and the top surface (e.g., backside surface) of the second electronic device 106.

As shown in FIG. 1A, the width of each of the first dummy traces 104*a* and the additional dummy trace 104*b* is substantially the same as the width of the trace of the interconnection traces 103*a*1. When warpage is occurred in the package structure 100 during for example a thermal process, a crack may occur in the package structure 100. In some situations, the crack can occur in the underfill material 108, in the encapsulant 110, in the at least one dielectric layer 102, or in the at least one circuit layer 103. As the dummy traces 104*a* and 104*b*, the interconnection traces 103*a*1 and/or the trace portions 103', 103" are formed by the same material and have the same width, the mechanical strength of the first dummy trace 104*a* or the second dummy trace 104*b* is the same as the mechanical strength of the trace of the first trace portions 103' or the interconnection traces 103*a*1. Thus, if one trace of the first trace portions 103' or the interconnection traces 103*a*1 cracks, one dummy trace of the dummy traces 104*a* and 104*b* can also crack. Thus, the dummy traces 104*a* and 104*b* can be used to determine the risk of a crack occurring in the trace of the first trace portions 103' or the interconnection traces 103*a*1. Thus, the dummy trace 104 may be used as a test structure to simulate the crack behavior. The crack of the trace of the first trace portions 103' or the interconnection traces 103*a*1 may be detected by testing the dummy trace 104 without testing or contacting the trace of the first trace portions 103' or the interconnection traces 103*a*1 directly.

Figure 2:
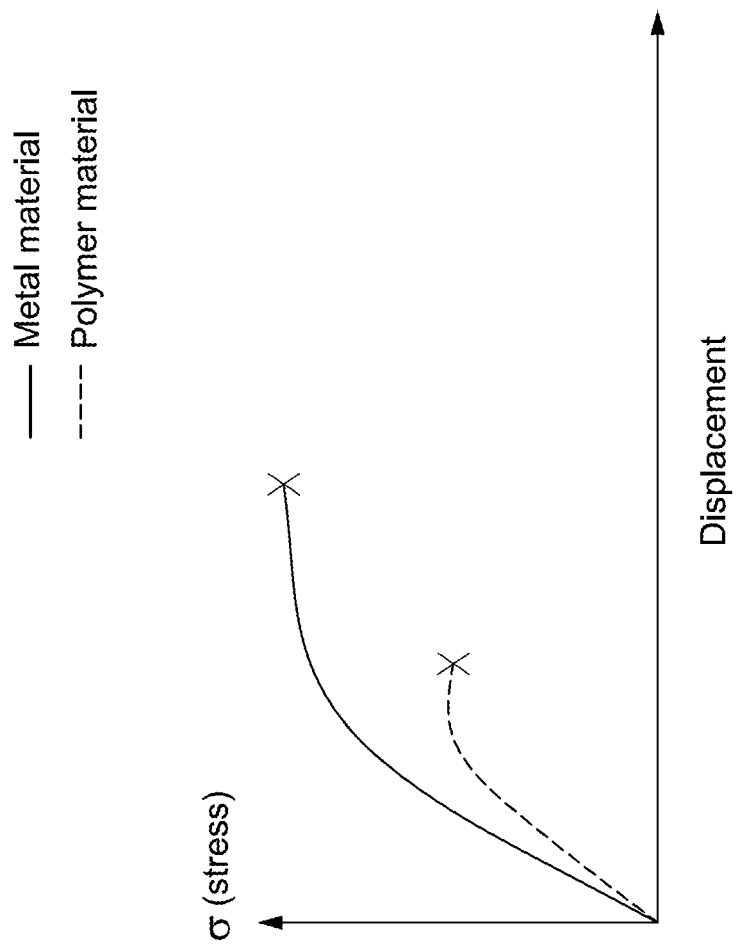
FIG. 2 is a diagram showing the stress applied to the materials with respect to the displacement of the materials.

FIG. 2 is a diagram showing the loading stress ($\sigma$) applied to the materials with respect to the displacement of the materials. As shown in FIG. 2, the young's modulus of a metal material is greater than the young's modulus of a polymer material. As the young's modulus of the dummy traces 104*a* and 104*b* (which is made of metal) is greater than that of the at least one dielectric layer 102 (which is made of polyimide (PI) for example) or that of the underfill material 108, when a crack occurs in the dielectric layer 102 or in the underfill material 108, the dummy trace 104*a* or 104*b* does not necessarily crack. The crack occurs in the dielectric layer 102 or in the underfill material 108 may extend or grow during subsequent thermal processes, and may increase the risk of a crack occurring in the other portions of the package structure 100 such as in the at least one circuit layer 103. Thus, a more sensitive or effective test structure (e.g., the dummy trace 304 of FIG. 3A and FIG. 3B) is needed.

Figure 3A:
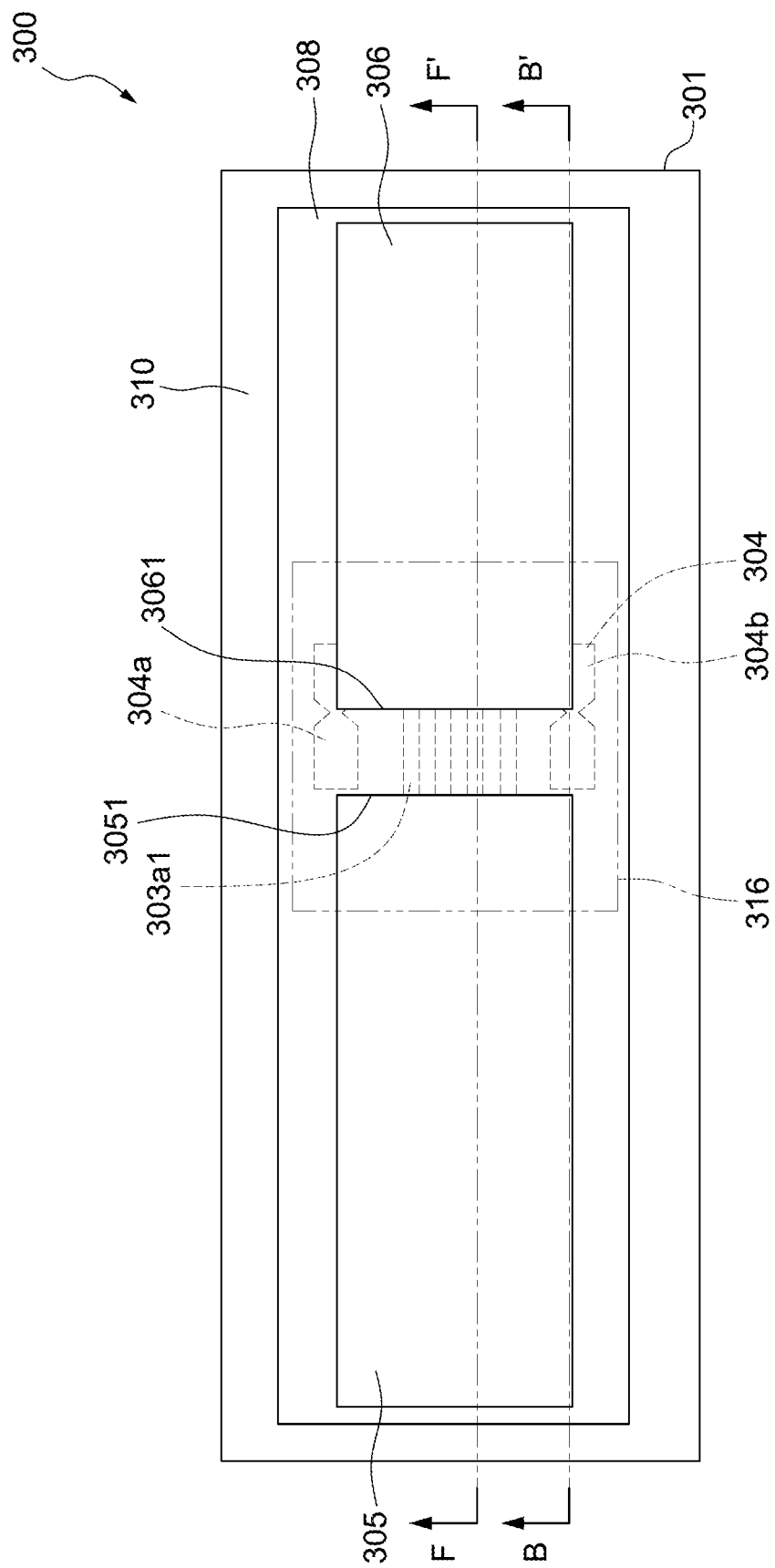
FIG. 3A illustrates a schematic top view of a package structure according to some embodiments of the present disclosure.
Figure 3B:
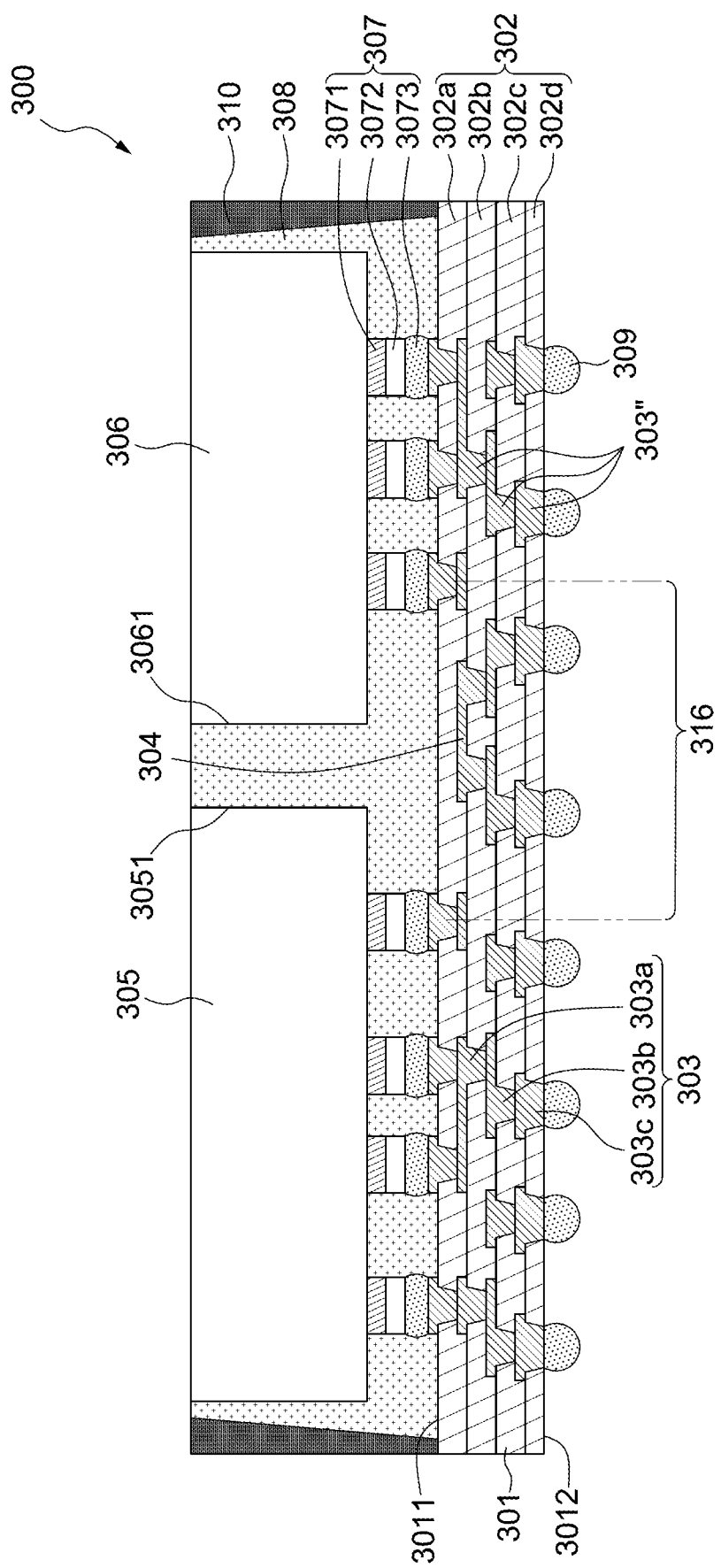
FIG. 3B illustrates a schematic cross-sectional view taken along line B-B' of a package structure of FIG. 3A.
Figure 3C:
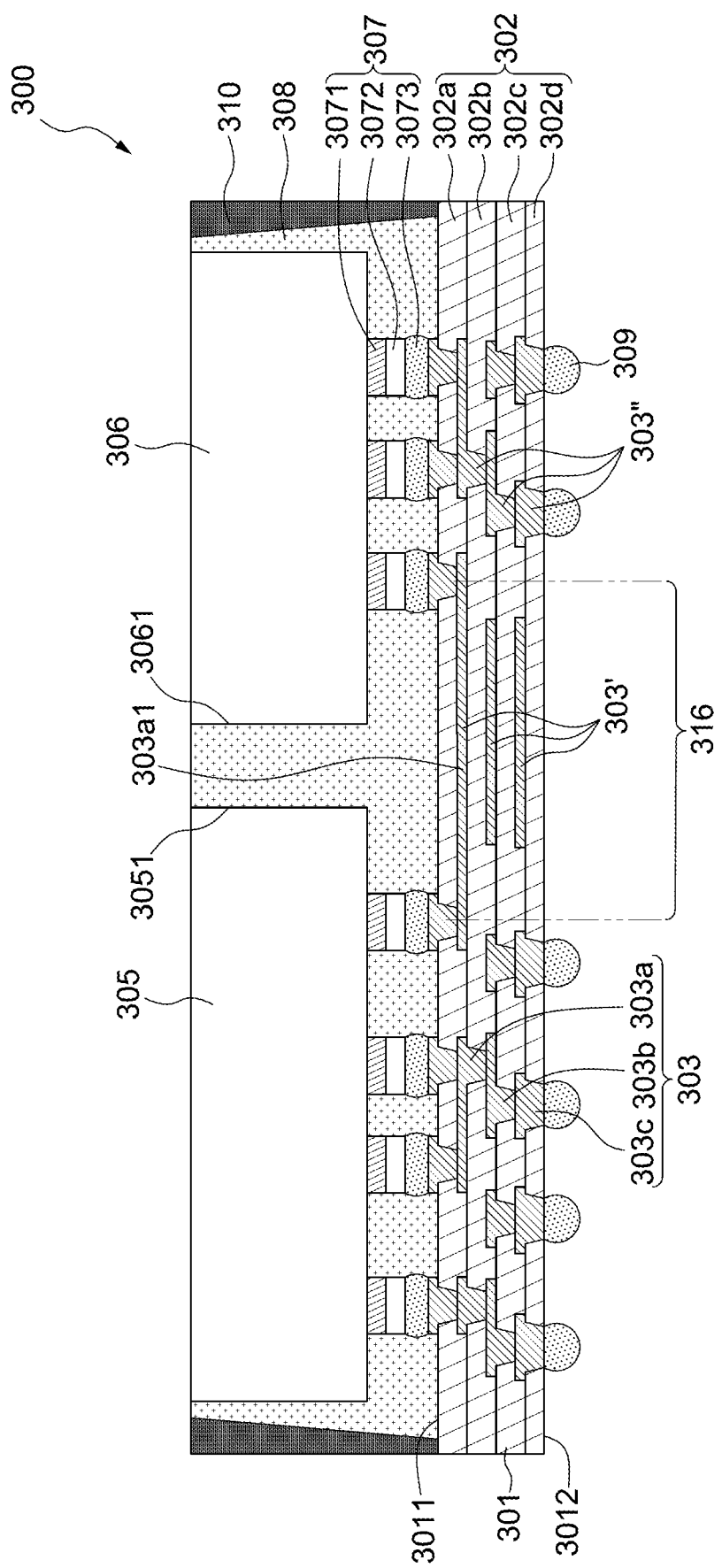
FIG. 3C illustrates a schematic cross-sectional view taken along line F-F' of a package structure of FIG. 3A.

FIG. 3A illustrates a schematic top view of a package structure 300 according to some embodiments of the present disclosure. FIG. 3B illustrates a schematic cross-sectional view taken along line B-B' of the package structure 300 of FIG. 3A. FIG. 3C illustrates a schematic cross-sectional view taken along line F-F' of the package structure 300 of FIG. 3A. Note that the package structure 300 of FIGS. 3A and 3B is similar to the package structure 100 of FIGS. 1A and 1B, except that the structure of the dummy trace 304 is different from the structure of the dummy trace 104.

As shown in FIGS. 3A, 3B, and 3C, the package structure 300 includes a wiring structure 301, at least one dummy trace 304, a first electronic device 305, a second electronic device 306, a plurality of bonding structures 307, an underfill material 308 an encapsulant material 310, and a plurality of solder balls 309. According to some embodiments of the present disclosure, the package structure 300 may include more than three electronic devices. The wiring structure 301 may include a redistribution structure (or a redistribution layer; RDL). The wiring structure 301 may include at least one dielectric layer 302 and at least one circuit layer 303. As shown in FIG. 3B, the at least one dielectric layer 302 includes dielectric layers 302*a*, 302*b*, and 302*c*. As shown in FIG. 3B, according to some embodiments of the present disclosure, the bonding structure 307 may include a plurality of electrical contacts 3071 connecting to the first electronic device 305 and the second electronic device 306, a plurality of bumps 3072, and a plurality of solder materials 3073. As shown in FIG. 3C, a topmost circuit layer 303*a* is the circuit layer that is nearest to the first electronic device 305 and/or the second electronic device 306, and the at least one dummy trace 304 and the interconnection traces 303*a*1 are disposed at the topmost circuit layer 303*a*.

Figure 3D:
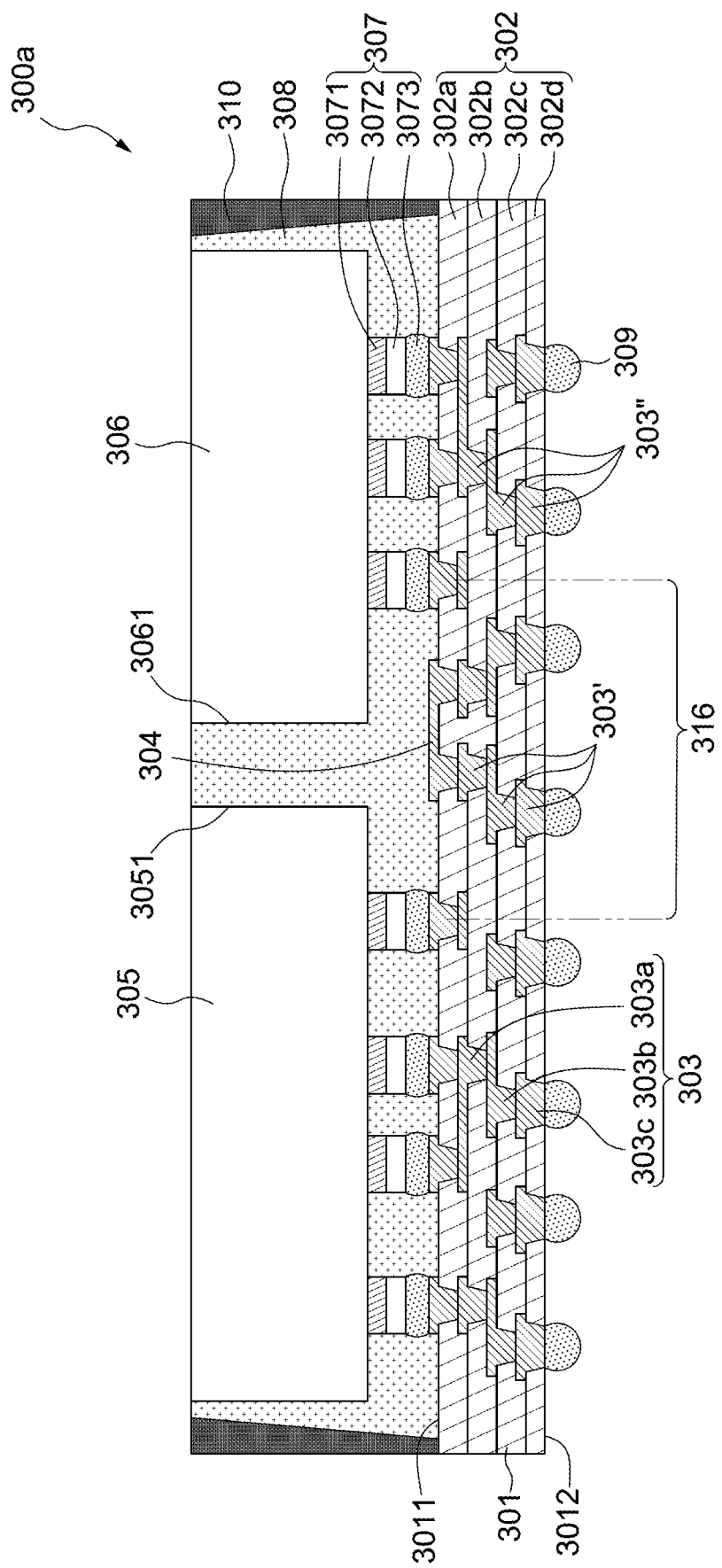
FIG. 3D illustrates a schematic cross-sectional view of a package structure according to some embodiments of the present disclosure.

FIG. 3D illustrates a schematic cross-sectional view of a package structure 300*a* according to some embodiments of the present disclosure. FIG. 3D is similar to FIG. 3B, except that the dummy trace 304 is disposed on the first surface 3011 of the wiring structure 301. Thus, the at least one dummy trace 304 is disposed above the topmost circuit layer 303*a*, and the at least one dummy trace 304 is also disposed above the interconnection traces 303*a*1. In some embodiments, the underfill material 308 may contact the at least one dummy trace 304.

According to some embodiments of the present disclosure, the material of the at least one dielectric layer 302 may include an insulating material, a passivation material, a dielectric material or a solder resist material, such as, for example, a benzocyclobutene (BCB) based polymer or a polyimide (PI). The material of the at least one circuit layer 303 may include, for example, copper, another conductive metal, or an alloy thereof. The material of the dummy trace 304 may include, for example, copper, another conductive metal, or an alloy thereof. The first electronic device 305 may include an application-specific integrated circuit (ASIC) device. The second electronic device 306 may include a high bandwidth memory (HBM) device. The material of the plurality of bonding structures 307 may include, for example, copper, another conductive metal, or an alloy thereof.

As shown in FIGS. 3B, 3C, and 3D, the wiring structure 301 has a first surface 3011 and a second surface 3012 opposite to the first surface 3011. The first electronic device 305 and the second electronic device 306 are mounted on the first surface 3011 of the wiring structure 301 through the plurality of bonding structures 307. That is, the first electronic device 305 and the second electronic device 306 are electrically connected to the first surface 3011 of the wiring structure 301 through flip-chip bonding. The underfill material 308 is disposed between the first electronic device 305 and the wiring structure 301, and/or between the second electronic device 306 and the wiring structure 101. According to some embodiments of the present disclosure, the top surface of the underfill material 308 is coplanar with the top surface (e.g., backside surface) of the electronic device 305 and the top surface (e.g., backside surface) of the second electronic device 306. According to some embodiments of the present disclosure, solder balls 309 are formed on the second surface 3012 of the wiring structure 301 and are in contact with the at least one circuit layer 303. The solder balls 309 may be used for external connections.

The encapsulant 310 may cover at least a portion of the first surface 3011 of the wiring structure 301, at least a portion of the first electronic device 305, at least a portion of the second electronic device 306 and the underfill material 308. A material of the encapsulant 310 may be a molding compound with or without fillers. The top surface of the encapsulant 310 may be coplanar with the top surface of the underfill material 308, the top surface (e.g., backside surface) of the electronic device 305 and the top surface (e.g., backside surface) of the second electronic device 306.

Figure 4A:
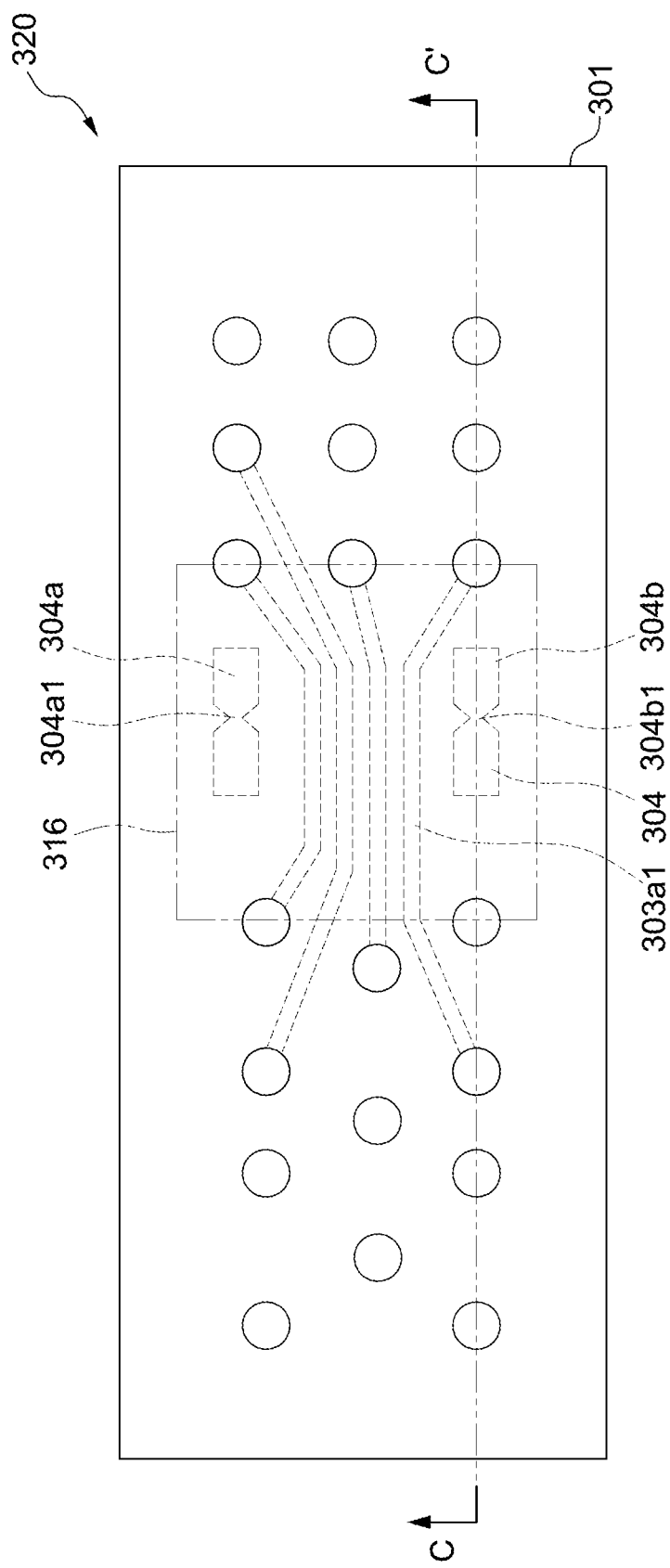
FIG. 4A illustrates a schematic top view of a wiring structure according to some embodiments of the present disclosure.
Figure 4B:
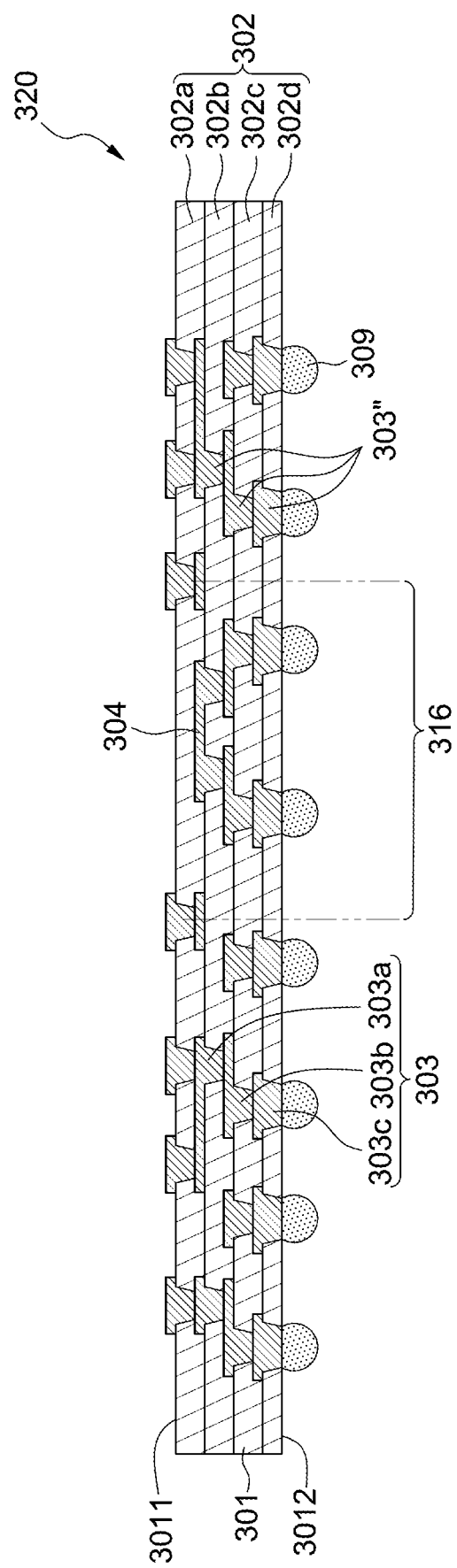
FIG. 4B illustrates a schematic cross-sectional view taken along line C-C' of the wiring structure of FIG. 4A according to some embodiments of the present disclosure.

FIG. 4A illustrates a schematic top view of circuit layer structure 320 according to some embodiments of the present disclosure. FIG. 4B illustrates a schematic cross-sectional view taken along line C-C' of the circuit layer structure 320 of FIG. 4A. The circuit layer structure 320 of FIG. 4A includes a wiring structure 301 and at least one dummy trace 304 that are similar to the wiring structure 101 and the dummy trace 104, respectively.

As illustrated in FIGS. 4A and 4B, the at least one circuit layer 303 further includes circuit layers 303a, 303b and 303c. The circuit layer 303a is a topmost circuit layer that is nearest to the first electronic device 305 and/or the second electronic device 306 (FIG. 3B). The interconnection traces 303a1 are the first trace portions 303' of the circuit layer 303a. In some embodiments, the at least one dummy trace 304 and the interconnection traces 303a1 are disposed at the same layer (i.e., the topmost circuit layer 303a). The first trace portions 303' are located in a high density region (or a fine line region) 316 between the electronic devices 305 and 306 and the second trace portions 303" are located outside the high density region 316 (e.g., a low density region). According to some embodiments of the present disclosure, the first trace portions 303' are between the first electronic device 305 and the second electronic device 306. More specifically, according to some embodiments of the present disclosure, the first trace portions 303' are between a first projection of the first electronic device 305 on the wiring structure 301 and a second projection of the second electronic device 306 on the wiring structure 301. According to some embodiments of the present disclosure, the electronic devices 305 and 306 may be electrically connected to each other through the interconnection traces 303a1. The electronic devices 305 and 306 may be electrically connected to the solder balls 309 on the second surface 3012 of the wiring structure 301 through the second trace portions 303" of the at least one circuit layer 303. A line width/line space (L/S) of the first trace portions 303' may be less than an L/S of the traces of the second trace portions 303". For example, an L/S of the traces of the first trace portions 303' may be less than or equal to about 5 μm/about 5 μm, or less than or equal to about 2 μm/about 2 μm, or less than or equal to about 0.8 μm/about 0.8 μm. An L/S of the traces of the second trace portions 303" may be less than or equal to about 10 μm/about 10 μm, or less than or equal to about 7 μm/about 7 μm, or less than or equal to about 5 μm/about 5 μm.

As shown in FIGS. 4A and 4B, the at least one dummy trace 304 may include a first dummy trace 304a and an additional dummy trace 304b. According to some embodiments of the present disclosure, the at least one dummy trace 304 may include only one dummy trace or more than three dummy traces. As shown in FIGS. 4A and 4B, the first dummy trace 304a and the additional dummy trace 304b are disposed on the wiring structure 301 and are adjacent to the interconnection traces 303a1. According to some embodiments of the present disclosure, the dummy trace 304 and the interconnection traces 303a1 (first trace portions 303') are formed through the same manufacturing process concurrently. According to some embodiments of the present disclosure, the dummy trace 304 and the interconnection traces 303a1 (first trace portions 303') are made of the same material.

As shown in FIG. 4A, the first dummy trace 304a and the additional dummy trace 304b are designed to have a stripe shape and respectively include a neck-shape portion 304a1 and a neck-shape portion 304b1. As shown in FIG. 4A, the first dummy trace 304a and the additional dummy trace 304b are adjacent to the first trace portions 303'. According to some embodiments of the present disclosure, the width of the neck-shape portion 304a1 or 304b1 of the dummy trace 304a or the additional dummy trace 304b may be less than the width of the first trace portion 303'. According to some embodiments of the present disclosure, the neck-shape portion 304a1 or 304b1 is the weak portion in structure at which stress is concentrated. As shown in FIG. 4A, the longitudinal axis of the first dummy trace 304a or the additional dummy trace 304b is parallel to the longitudinal axis of at least a portion of the interconnection traces 303a1 or the first trace portions 303'. According to some embodiments of the present disclosure, the first dummy trace 304a and the additional dummy trace 304b may be designed to have other different shapes, which are described in further detail below. According to some embodiments of the present disclosure, the first dummy trace 304a and the additional dummy trace 304b may be perpendicular to each other. According to some embodiments of the present disclosure, the dummy traces 304a and 304b are designed to have a mechanical strength which is equivalent to or less than the mechanical strength of the interconnection traces 303a1. According to some embodiments of the present disclosure, the mechanical strength of the dummy traces 304a and 304b and the mechanical strength of the interconnection traces 303a1 or the first trace portions 303' include tensile strengths and/or shear strengths. According to some embodiments of the present disclosure, the dummy traces 304a and 304b are designed to have a yield strength which is equivalent to or less than the yield strength of the interconnection traces 303a1 or the first trace portions 303'. According to some embodiments of the present disclosure, as shown in FIG. 4A, the dummy traces 304a and 304b respectively include a neck-shape portion 304a1 and a neck-shape portion 304b1, and each includes at least one V-shaped notch (in this case two V-shape notches). According to some embodiments of the present disclosure, the dummy traces 304a or 304b would crack before the trace of the interconnection traces 303a1 or the first trace portions 303' cracks under stress. That is to say, if the dummy traces 304a or 304b does not crack under stress, it indicates that there may be no trace of the interconnection traces 303a1 or the first trace portions 303' cracked under the same stress. Thus, the dummy trace 304 may be used as a test structure to simulate the crack behavior. The crack of the trace of the first trace portions 303' or the interconnection traces 303a1 may be detected by testing the dummy trace 304 without testing the trace of the first trace portions 303' or the interconnection traces 303a1 directly. It is noted that the dummy trace 304 may be cracked more easier than the first trace portions 303' or the interconnection traces 303a1. That is, before the first trace portions 303' or the interconnection traces 303a1 crack, the dummy trace 304 may crack already.

Referring back to FIGS. 3A and 3B, the first dummy trace 304a and the additional dummy trace 304b are located adjacent to the interconnection traces 303a1' which are near the corner of the second electronic device 306. According to some embodiments of the present disclosure, the first dummy trace 304a and the additional dummy trace 304b may be located adjacent to the interconnection traces 303a1 near and under the corner of the second electronic device 306 (or the first electronic device 305). When a package structure such as package structure 300 is under stress, a crack is likely to occur near the corner of any one of the electronic devices 305, 306. Thus, as shown in FIG. 3A, the neck portion 304a1 or 304b1 of the first dummy trace 304a or the additional dummy trace 304b is disposed under and near the corner of the second electronic device 306. According to some embodiments of the present disclosure, the neck-shape portion 304a1 or 304b1 of the first dummy trace 304a or the additional dummy trace 304b may be disposed near and right under the corner of the second electronic device 306. As shown in FIGS. 3A and 3B, the at least one dummy trace 304a or 304b includes a structurally weak portion 304a1 or 304b1 (i.e., the neck portion 304a1 or 304b1), and the structurally weak portion 304a1 or 304b1 overlaps with a projection of an edge 3051 of the first electronic device 305 on the wiring structure 301 or a projection of an edge 3061 of the second electronic device 306 on the wiring structure 301.

Figure 5A:
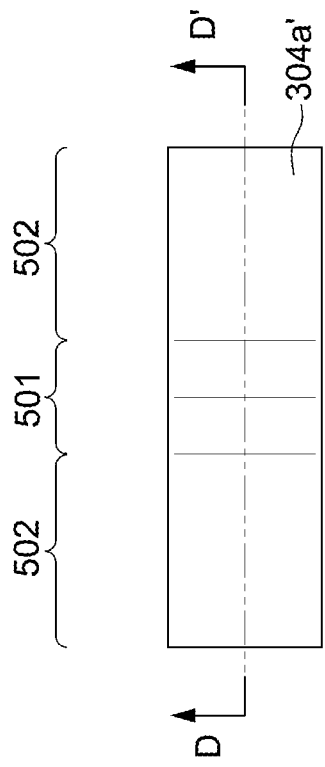
FIGS. 5A-5D each illustrates a schematic top view of a dummy trace according to some embodiments of the present disclosure.
Figure 5B:
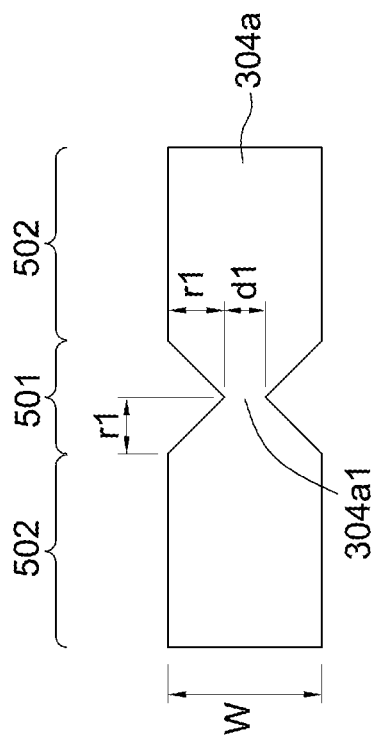

FIGS. 5A and 5B illustrate a schematic top view of a dummy trace 304a according to some embodiments of the present disclosure. FIG. 5B is similar to FIG. 5A, except for the apex portion or end portions of the V-shaped notch includes a curved shape.

When designing the dummy trace 304, the corner of the electronic device 306 is taken into consideration, as a crack is likely to occur near the corner of an electronic device. According to some embodiments of the present disclosure, in order to detect a risk of a crack occurring in the underfill material 308 near the corner of the electronic device 306 before a crack actually occurs, the effective stress ($\sigma_E$) at the corner of the electronic device 306 needs to be smaller than the strength of the underfill material 308 ($S_E$) when a loading stress ($\sigma$) is applied to the package structure 300 so that a crack would not occur in the underfill material 308. The concentration factor at the corner of the electronic device 306 is denoted as $K_E$. Then, the following equation can be obtained: $\sigma_E = K_E \cdot \sigma < S_E$. According to experiments, the concentration factor $K_E$ is associated with thickness of the electronic device 306 and the height of the gap between the bottom of the electronic device 306 and the surface 3011 of the wiring structure 301.

Furthermore, according to some embodiments of the present disclosure, in order to detect a risk of a crack occurring in the underfill material 308 near the corner of the electronic device 306, a crack occurs at the neck-shape portion 304a1 or 304b1 of the dummy trace 304a or 304b can be used as an indication. The effective stress ($\sigma_C$) at the neck-shape portion 304a1 or 304b1 of the dummy trace 304a or 304b needs to be greater than the material strength ($S_C$) of the neck-shape portion 304a1 or 304b1 of the dummy trace 304a or 304b when a loading stress ($\sigma$) is applied to the package structure 300 so that a crack can occur in the neck-shape portion 304a1 or 304b1 of the dummy trace 304a or 304b. The concentration factor at the neck-shape portion 304a1 or 304b1 of the dummy trace 304a or 304b is denoted as $K_C$. Then, the following equation can be obtained: $\sigma_C = K_C \cdot \sigma > S_C$.

In the situation that the dummy trace 304a or 304b is broken while the underfill material 308 remains not broken under a loading stress ($\sigma$), according to the above-mentioned two equations, the loading stress should be within a range specified by the following equation: $S_E/K_E > \sigma > S_C/K_C$. Thus, the following equation can be obtained: $K_C/K_E > S_C/S_E$. This equation can be used for designing the dummy trace 304a or 304b so as to simulate the above-mentioned situation.

As shown in FIGS. 5A and 5B, the height of the V-shape notch at the neck-shape portion 304a1 or 304b1 is denoted as "r1," the width of the neck-shape portion 304a1 or 304b1 is denoted as "d1," and the width of the dummy trace 304a or 304b is denoted as "w." Note that the longitudinal distance between the apex of the V-shape notch to each of the two ends of the V-shape notch is also r1. That is, the V-shape notch may be replaced by a semi-circular shaped notch with a radius of "r1". According to experiments, the concentration factor $K_C$ is associated with r1 and the width (d1) of the neck portion 304a1 or 304b1.

According to some embodiments of the present disclosure, the ratio of w to d1 (w/d1) is designed to be within a range of 1.05 to 3. According to some embodiments of the present disclosure, the ratio of r1 to d1 (r1/d1) is designed to be within a range of 0.01 to 0.4. According to some embodiments of the present disclosure, the ratio of r1 to d1 (r1/d1) is less than 0.2.

As shown in FIGS. 5A and 5B, the dummy trace 304a has a first portion 501 and a second portion 502. A width of the second portion 502 is greater than a width of the first portion 501 so that a mechanical strength of the first portion 501 of the dummy trace 304a is less than a mechanical strength of the second portion 502 of the dummy trace 304a.

Figure 5C:
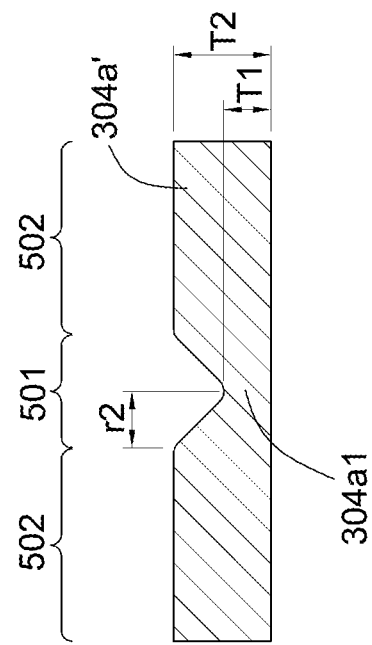
Figure 5D:
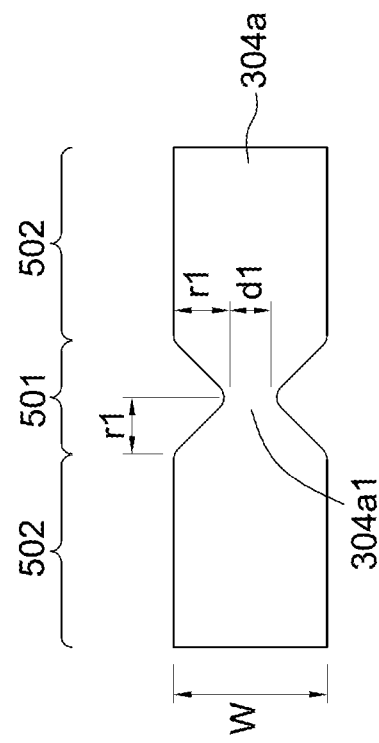

FIG. 5C illustrates a schematic top view of a dummy trace 304a' according to some embodiments of the present disclosure. FIG. 5D illustrates a schematic cross-sectional view taken along line D-D' of the dummy trace of FIG. 5C. As shown in FIGS. 5C and 5D, the neck-shape portion 304a1 is thinner than other portions of the dummy trace 304a' and includes a V-shape notch or trench. As shown in FIG. 5D, the height of the V-shape notch or trench at the neck-shape portion 304a1 or 304b1 is denoted as "r2," the thickness of the neck-shape portion 304a1 or 304b1 is denoted as "T1," and the width of the dummy trace 304a or 304b is denoted as "w." Note that the longitudinal distance between the bottom of the V-shape notch or trench to each of the two edges of the V-shape notch or trench is also r2.

As shown in FIG. 5D, the dummy trace 304a' has a first portion 501 and a second portion 502. A thickness "T2" of the second portion 502 is greater than a thickness "T1" of the first portion 501 so that a mechanical strength of the first portion 501 of the dummy trace 304a' is less than a mechanical strength of the second portion 502 of the dummy trace 304a'.

Figure 6:
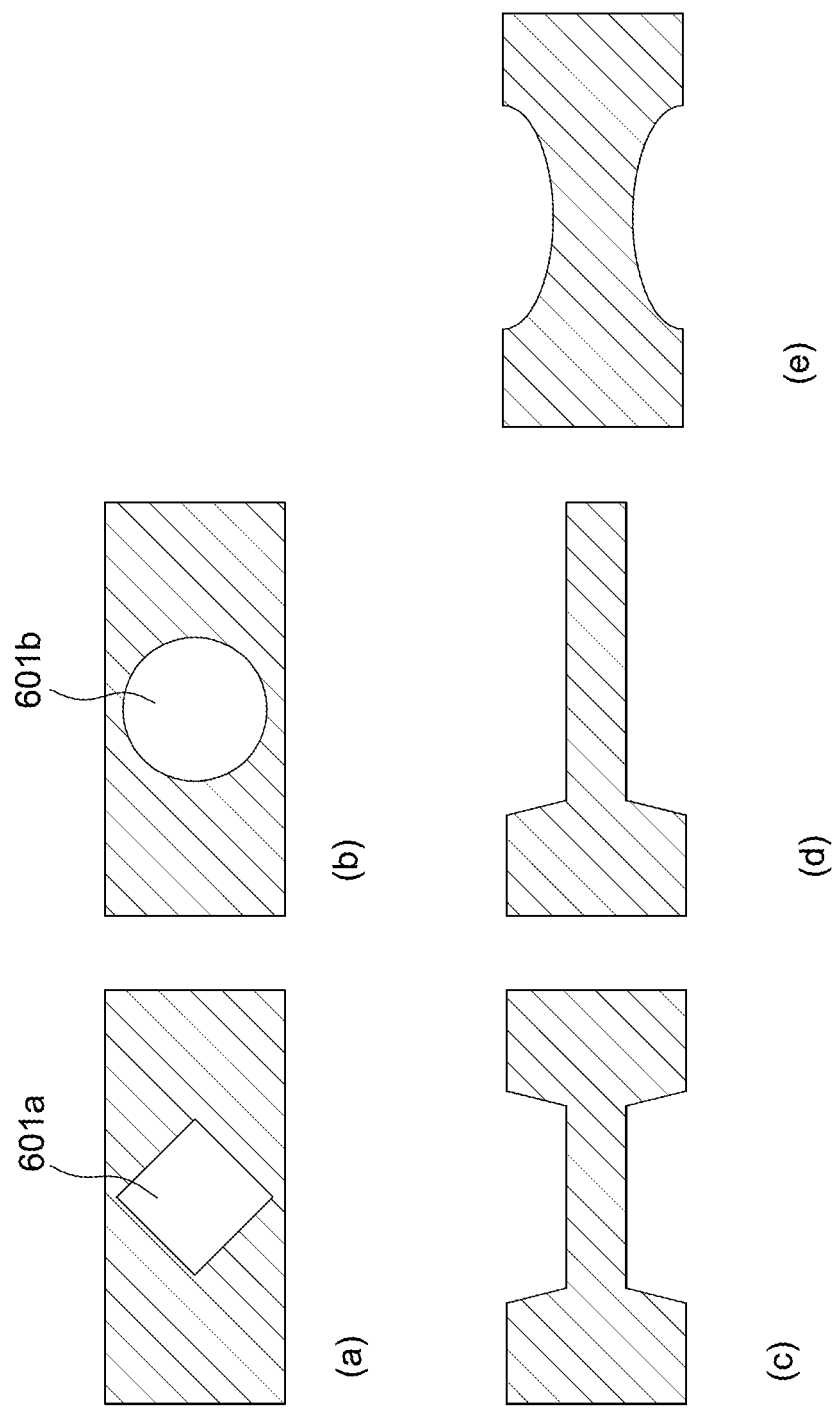
FIG. 6 illustrates several exemplified shapes of the dummy trace according to some embodiments of the present disclosure.

FIG. 6 illustrates several exemplified shapes of the dummy trace 304 according to some embodiments of the present disclosure. According to some embodiments of the present disclosure, the dummy trace 304 may be designed to have various shapes. According to some embodiments of the present disclosure, the dummy trace 304 may define a through hole 601a, 601b from a top view. As shown in FIG. 6, the dummy trace 304 may be (a) in a stripe shape with a through hole 601a, (b) in a stripe shape with a circular through hole 601b, (d) in a I-shape, (e) in a T-shape, or (e) in a stripe shape with an arc neck-shape portion. According to some embodiments of the present disclosure, the dummy trace 304 actually can be in any shape as long as its mechanical strength is equal to or less than the mechanical strength of the interconnection traces 303a1 or the first trace portions 303'.

Figure 7C:
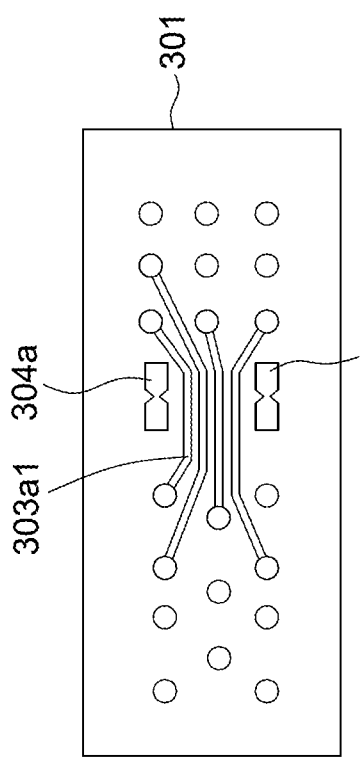
FIGS. 7A-7F illustrates some schematic top views of a package structure, wherein the electronic devices, the bonding structures, the underfill material and the encapsulant are omitted for clear demonstration according to some embodiments of the present disclosure.
Figure 7D:
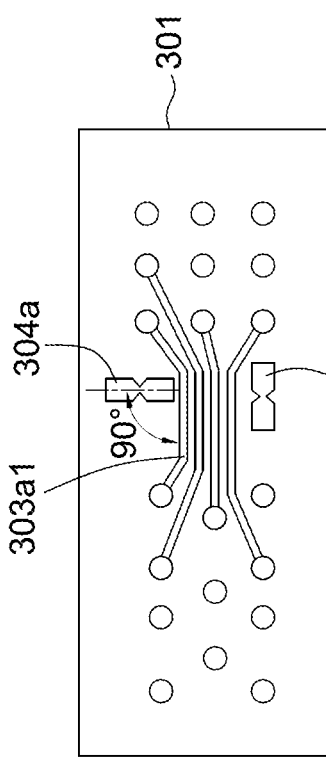
Figure 7A:
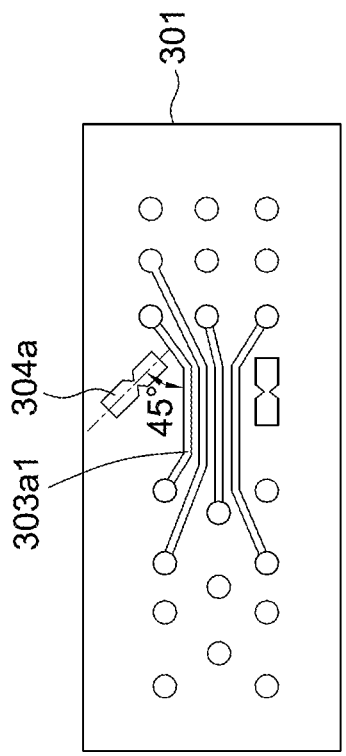
Figure 7B:
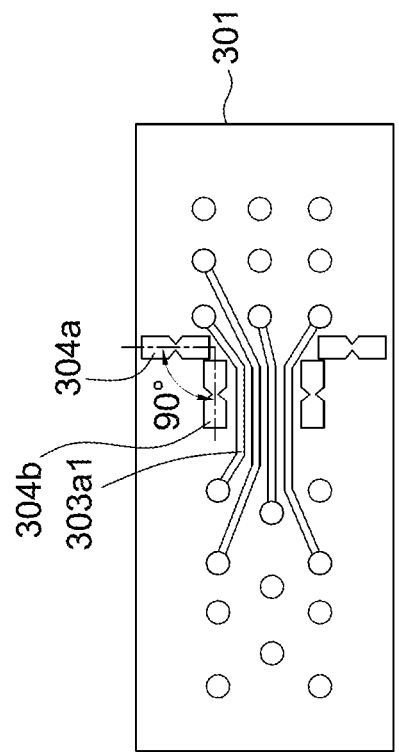

FIGS. 7A-7F illustrates some schematic top views of a package structure 300, wherein the electronic devices 305 and 306, the bonding structures 307, the underfill material 308 and the encapsulant 310 are omitted for clear demonstration according to some embodiments of the present disclosure. In FIG. 7A-7F, several exemplified arrangements of the dummy traces 304a and 304b are illustrated, according to some embodiments of the present disclosure. As shown in FIG. 7A, the longitudinal axis of each of the dummy traces 304a and 304b is parallel to a longitudinal axis of the interconnection traces 303a1 or the first trace portions 303'. As shown in FIG. 7B, the longitudinal axis of the dummy traces 304a is perpendicular to a longitudinal axis of the interconnection traces 303a1 or the first trace portions 303'. As shown in FIG. 7C, the longitudinal axis of the dummy trace 304a and a longitudinal axis of the interconnection traces 303a1 or the first trace portions 303' form a 45 degree angle, and the longitudinal axis of the dummy trace 304b is parallel to a longitudinal axis of the interconnection traces 303a1 or the first trace portions 303'. As shown in FIG. 7D, the longitudinal axis of the dummy trace 304a is parallel to a longitudinal axis of the interconnection traces 303a1 or the first trace portions 303', and the longitudinal axis of the dummy trace 304b is perpendicular to a longitudinal axis of the first trace portions 303'. That is, the two dummy traces 304a, 304b are substantially perpendicular to each other.

Figure 7F:
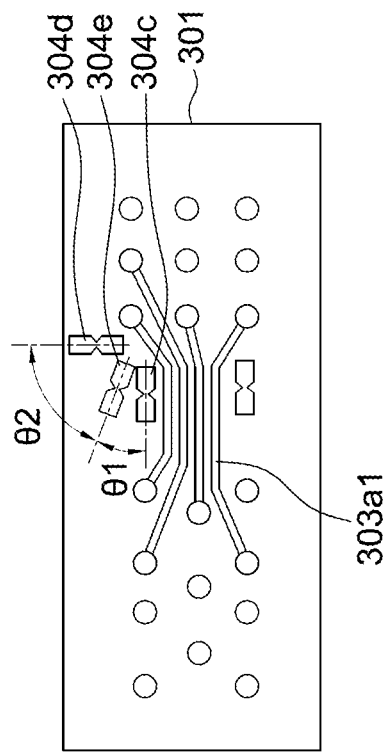
Figure 7E:
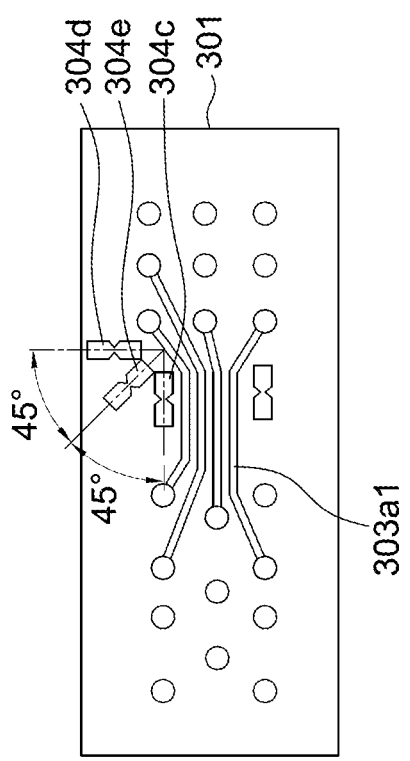

As shown in FIG. 7E, the at least one dummy trace 304 includes a first dummy trace 304c, a second dummy trace 304d and a third dummy trace 304e, wherein an inclination angle between the first dummy trace 304c and the third dummy trace 304d is substantially 45 degrees, and an inclination angle between the second dummy trace 304d and the third dummy trace 304e is substantially 45 degrees. According to some embodiments of the present disclosure the first dummy trace 304c and the second dummy trace 304d are substantially perpendicular to each other, and the third dummy trace 304e is not parallel with first dummy trace 304c and the second dummy trace 304d. As shown in FIG. 7F, an inclination angle between the first dummy trace 304c and the third dummy trace 304e is θ1 degrees, and an inclination angle between the second dummy trace 304d and the third dummy trace 304e is θ2 degrees, and θ1 is different from θ2. Note that the dummy traces 304c, 304d and 304e can be arranged in any directions on demand and are not limited to the arrangements shown in FIGS. 7A-7F.

Figure 8A:
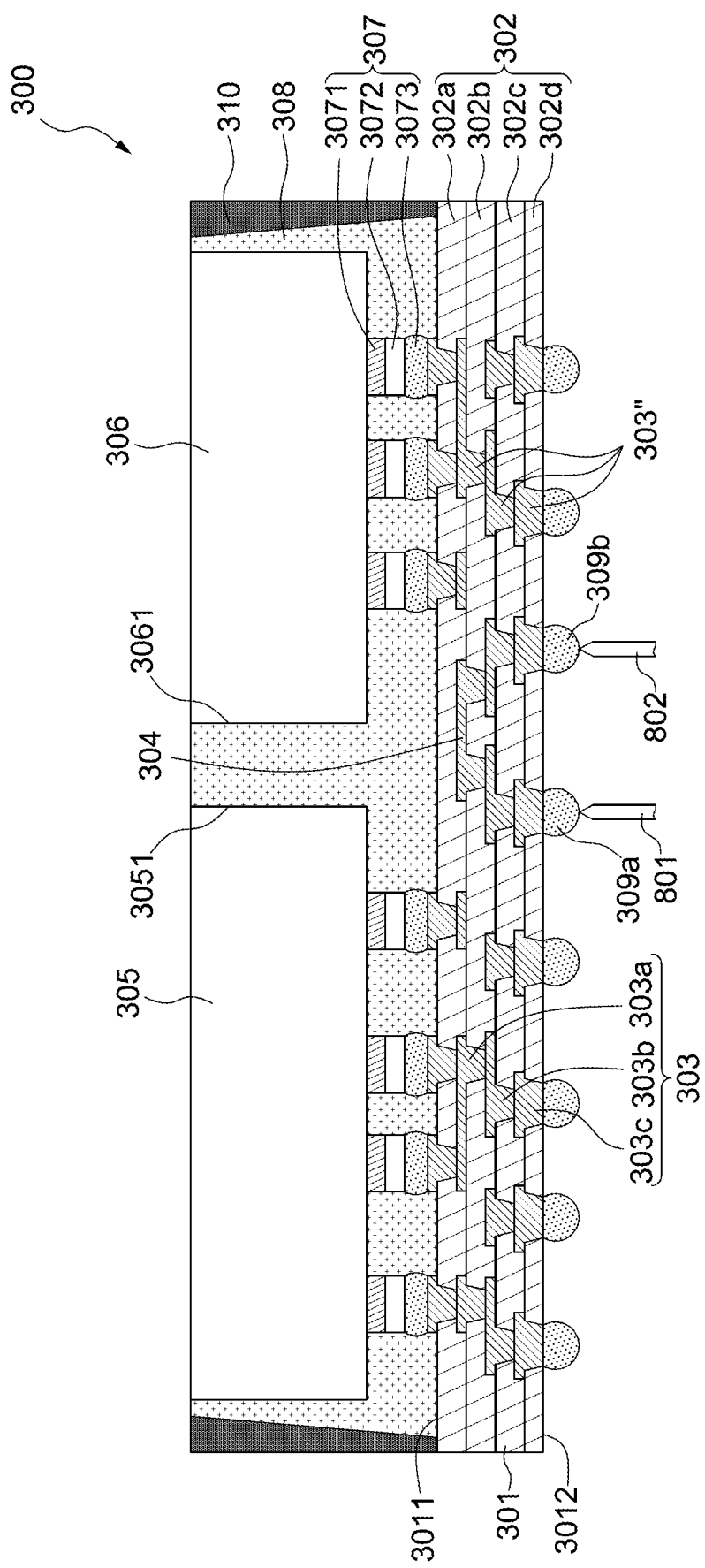
FIGS. 8A and 8B each illustrate a method for checking the condition of the dummy trace according to some embodiments of the present disclosure.
Figure 8B:
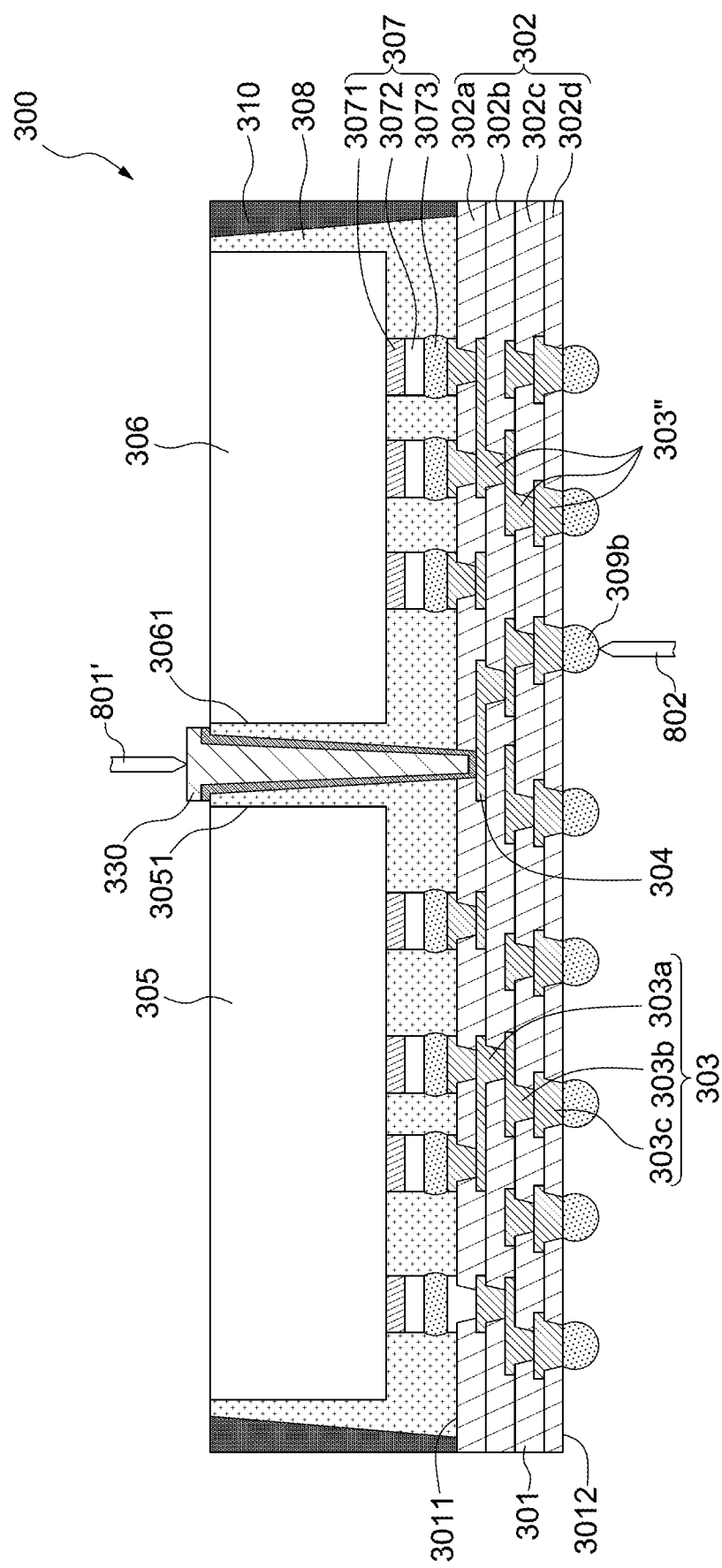

FIGS. 8A and 8B each illustrate a method for testing the dummy trace 304 according to some embodiments of the present disclosure. Since the dummy trace 304 (e.g., the dummy trace 304a or dummy trace 304b) is located inside the package structure 300, checking whether a crack occurs in the dummy trace 304 (e.g., the dummy trace 304a or dummy trace 304b) by visual inspection is almost impossible. According to some embodiments of the present disclosure, testing dummy trace 304 may be performed by determining the electrical property of the dummy trace 304. According to some embodiments of the present disclosure, testing the dummy trace 304 includes determining whether a crack is occurred in the dummy trace 304. According to some embodiments of the present disclosure, testing the dummy trace 304 includes determining whether a current can flow through the dummy trace 304. According to some embodiments of the present disclosure, as shown in FIG. 8A, two terminals of the dummy trace 304 (e.g., the dummy trace 304a or dummy trace 304b) is respectively electrically connected to two electrical paths which are formed by the at least one circuit layers 303b and 303c, and wherein a testing signal is applied to one of the electrical paths and the other one of the electrical path is grounding. According to some embodiments of the present disclosure, determining an electrical property of the dummy trace 304 includes providing a test electrical current to one of the two electrical paths and detecting a voltage difference between the two electrical paths. According to some embodiments of the present disclosure, determining a condition of the dummy trace 304 includes determining whether an electrical resistance of the dummy trace 304 reaches a threshold value.

As shown in FIG. 8A, the test electrical current may be provided through the two solder balls 309a and 309b, which are electrically connected to the two terminals of dummy trace 304 through the electrical paths which are formed by the at least one circuit layers 303b and 303c. Thus, according to some embodiments of the present disclosure, the electrical property of the dummy trace 304 can be determined by detecting the voltage difference between the two solder balls 3091 and 3092 by using two electrical contacts (e.g., probes 801 and 802). Alternatively, according to some embodiments of the present disclosure, a fixed voltage may be applied across the two solder balls 309a and 309b. In this case, the electrical property of the dummy trace 304 can be determined by detecting the current flowing through the two solder balls 309a and 309b by using two electrical contacts 801 and 802. If the dummy trace 304 breaks into two pieces, then it causes an open loop and no current can flow through the two solder balls 309a and 309b. According to some embodiments of the present disclosure, since the electrical resistance of dummy trace 304 would increase when it is stretched under stress, the condition of the dummy trace 304 can also be determined based on its electrical resistance. If the electrical resistance of the dummy trace 304 reaches a threshold value, it means that a crack may occur in dummy trace 304.

In FIG. 8B, the package structure 300 is similar to the same as the package structure 300 in FIG. 8A, except for an additional electrical path (which may be, for example, a bump or a through-via) 330 provided in the package structure 300. As shown in FIG. 8B, the additional electrical path 330 is formed through the underfill material 308 and or the encapsulant 310. One end of the electrical path 330 contacts one terminal of the dummy trace 304 and the other end of the additional electrical path 330 protrudes from the underfill material 308. Thus, the electrical property of the dummy trace 304 can be detected by similar ways as mentioned above. For example, the electrical property of the dummy trace 304 can be detected by detecting the voltage difference between the protruded end of the additional electrical path 330 and one of the two solder balls 309a and 309b (in this case the solder ball 309b) through two electrical contacts 801' and 802. In some embodiments, the package structure 300 may further comprise a conductive via 330 extending through the underfill material 308 and/or the encapsulant 310 and electrically connected to the at least one dummy trace 340. That is, the additional electrical path 330 is the conductive via 330.

Figure 9A:
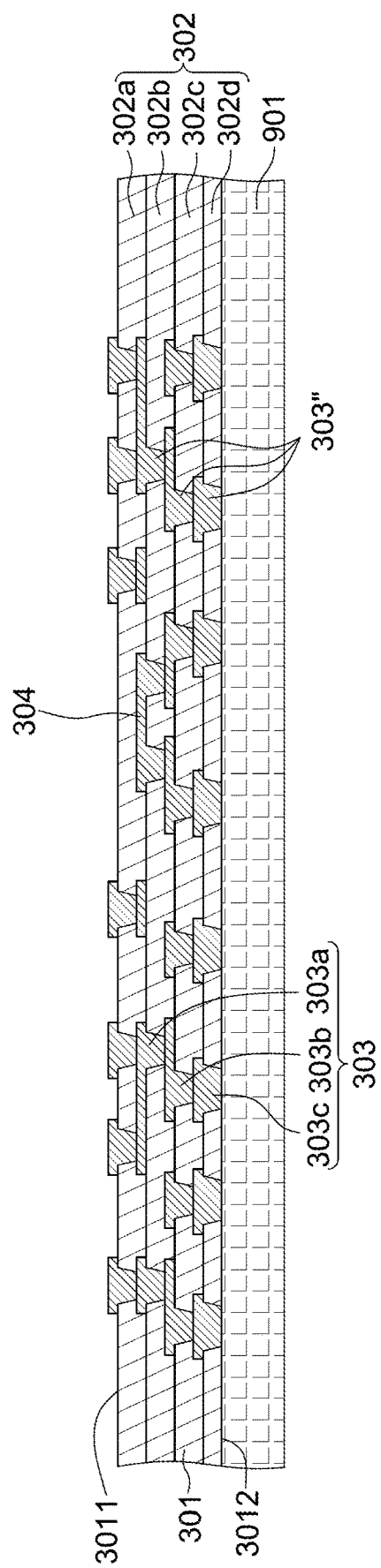
FIGS. 9A-9F illustrates one or more stages of an example of a manufacturing method of a package structure according to some embodiments of the present disclosure.
Figure 9B:
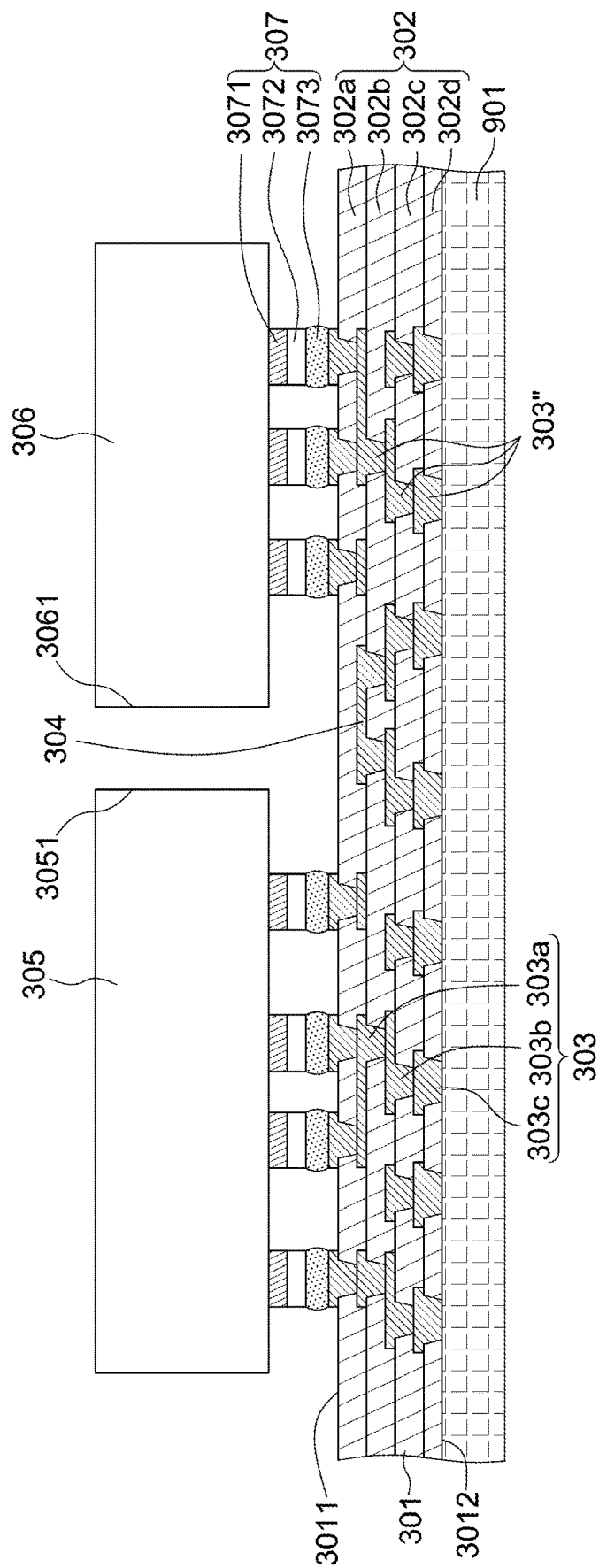
Figure 9C:
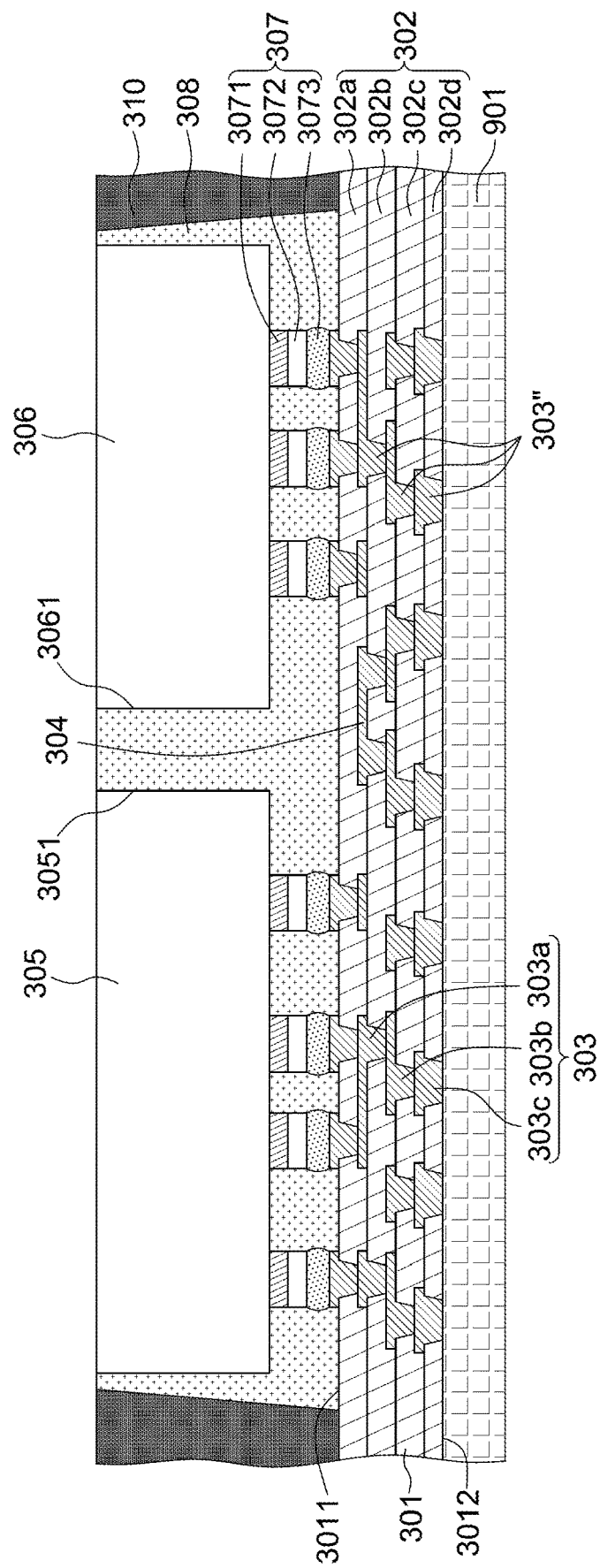

FIGS. 9A-9F illustrates one or more stages of an example of a manufacturing method of an assembly 4 including a package structure 300 according to some embodiments of the present disclosure. As shown in FIG. 9A, a carrier 901 and a wiring structure 301 are provided. The wiring structure 301 is formed on the carrier 901 and includes a redistribution structure which is formed by stacked dielectric layers 302 and circuit layers 303. Note that as mentioned above, the dummy trace 304 and the interconnection traces 303a1 may be formed through the same manufacturing process on the wiring structure 301, and the dummy trace 304 and the interconnection traces 303a1 may be formed of the same material. As shown in FIG. 9B, the two electronic devices 305 and 306 are mounted on wiring structure 301 through a plurality of bonding structure 307 by flip chip bonding. As shown in FIG. 9C, the underfill material 308 is filled. The underfill material 308 is disposed between the first electronic device 305 and the wiring structure 301, and/or between the second electronic device 306 and the wiring structure 101. Then, an encapsulant 310 may be formed to cover at least a portion of the first surface 3011 of the wiring structure 301, at least a portion of the first electronic device 305, at least a portion of the second electronic device 306 and the underfill material 308.

Figure 9D:
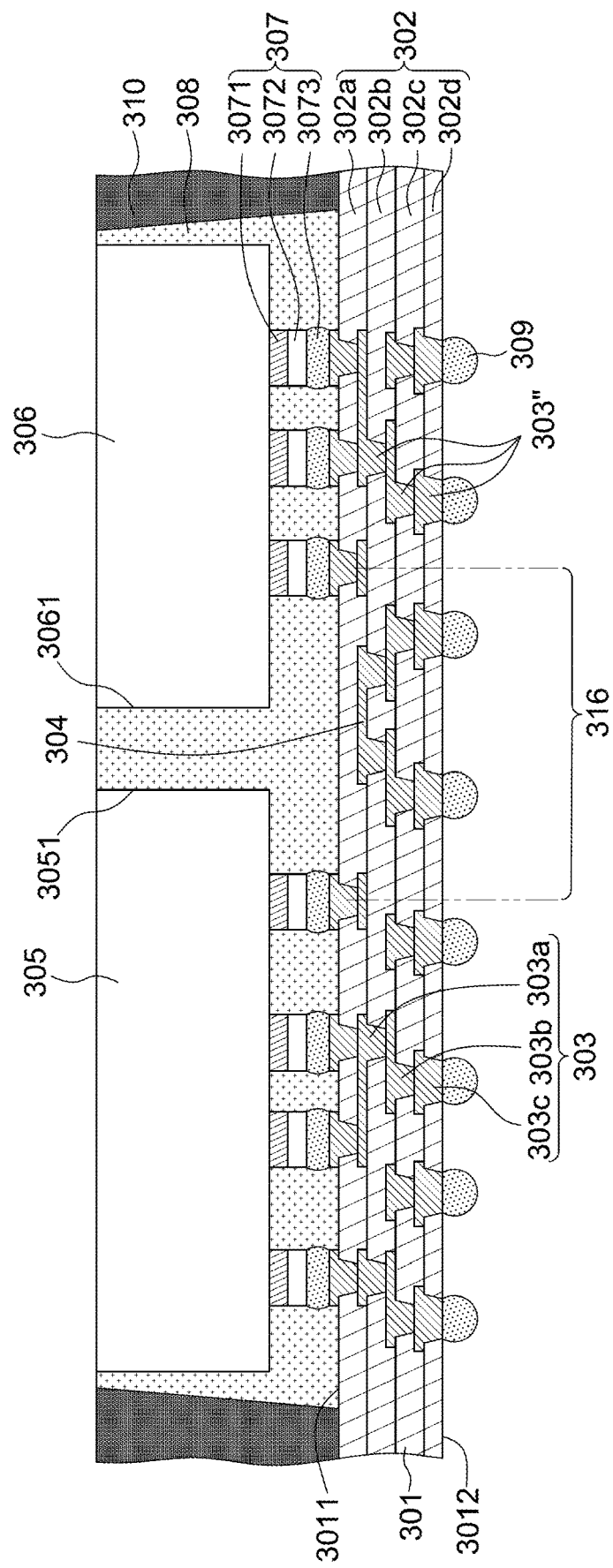
Figure 9E:
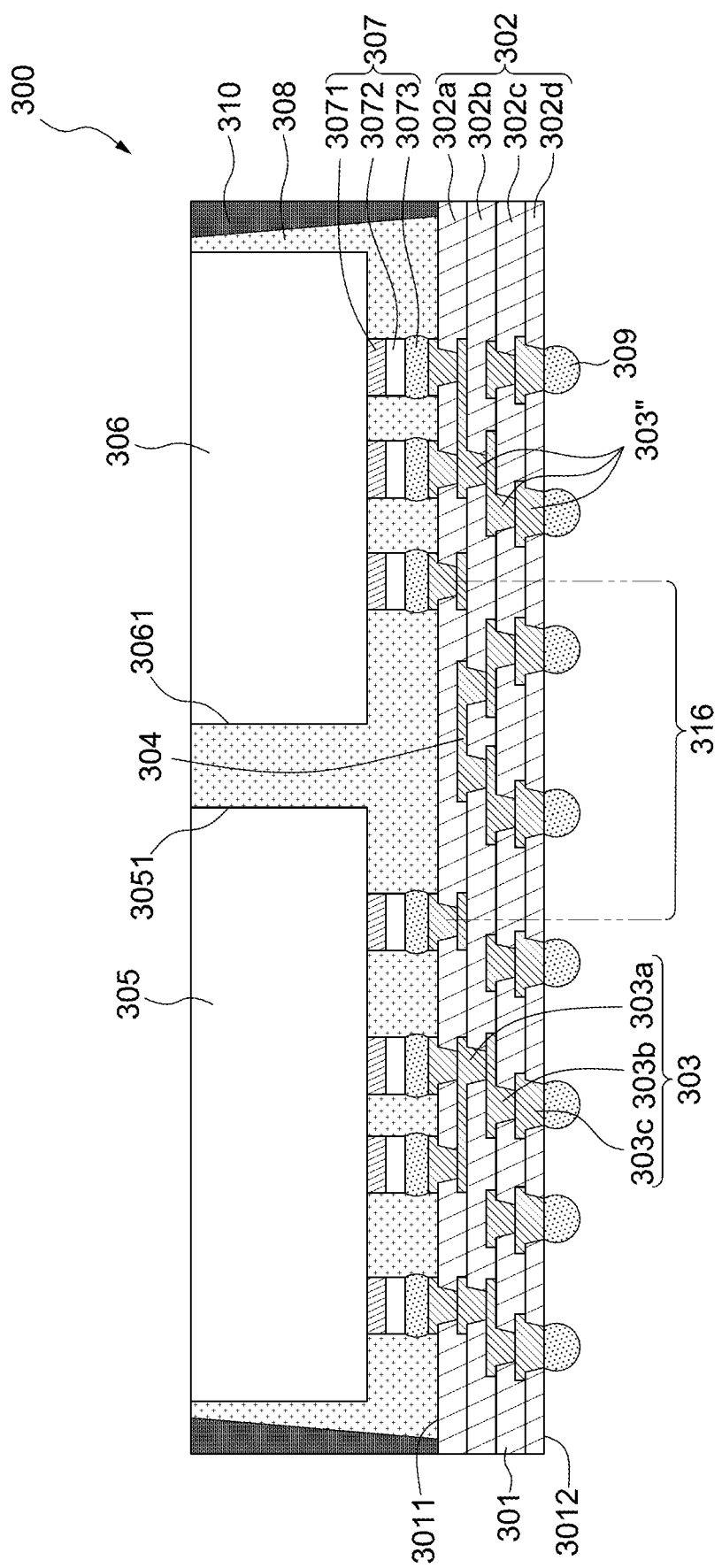

As shown in FIG. 9D, the carrier 901 is removed, and the solder balls 309 are formed on the second surface 3012 of the wiring structure 301 and are in electrical contact with the circuit layers 303. As shown in FIG. 9E, after a singulation process, a single package structure 300 is formed.

Figure 9F:
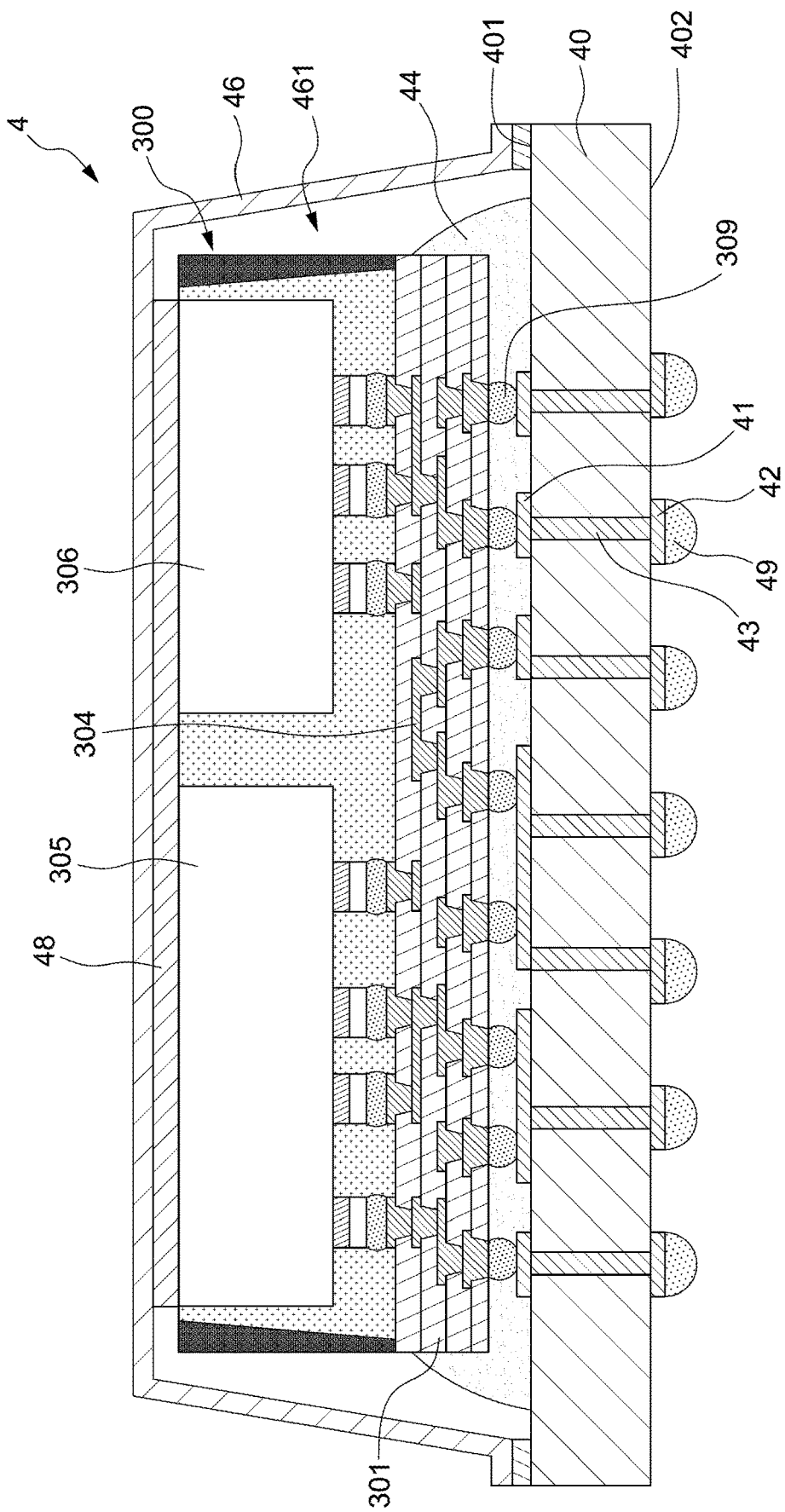

Referring to FIG. 9F, the package structure 3 may be electrically connected to a first patterned circuit 41 of a base substrate 40 through the solder balls 309. The base substrate 40 may have a first surface 401 and a second surface 402 opposite to the first surface 401. The base substrate 40 may include a first patterned circuit 41, a second patterned circuit 42, and a plurality of conductive vias 43. The first patterned circuit 41 may be disposed adjacent to the first surface 401 of the base substrate 40, and the second patterned circuit 42 may be disposed adjacent to the second surface 402 of the base substrate 40. The conductive vias 43 may extend through the base substrate 40 and electrically connect the first patterned circuit 41 and the second patterned circuit 42. Then, a protection material 44 (i.e., an underfill) is formed or disposed in a space between the package structure 3 and the base substrate 40 so as to cover and protect the solder balls 309 and the first patterned circuit 41.

Then, a heat sink 46 may be attached to the first electronic device 305, the second electronic device 306 and the base substrate 40. In some embodiments, the heat sink 46 may be a cap or hat structure, and may define a cavity 461 for accommodating the package structure 300. A portion of the heat sink 46 may be attached to the top surface of the package structure 300 through a thermal material 48 (e.g., thermal interface material (TIM)). Another portion (e.g., bottom portion) of the heat sink 46 may be attached to the base substrate 40 through an adhesive material. Then, a plurality of external connectors 49 (e.g., solder balls) may be formed or disposed on the second conductive circuit layer 42 for external connection. An assembly structure 4 as shown in FIG. 9F is thus obtained.

In some embodiments, the above-mentioned test (electrical test) may be conducted on the external connectors 49 (on the second surface 402 of the base substrate 40) to test the dummy trace 304.

Note that while the dummy trace 304 described above is located on the wiring structure 301 including a redistribution structure, the dummy trace can be applied to any semiconductor structures such as various of wiring structures, substrate or wafers, and can be located on any surfaces on or in the semiconductor structures, based on the concept as described above.

Figure 10:
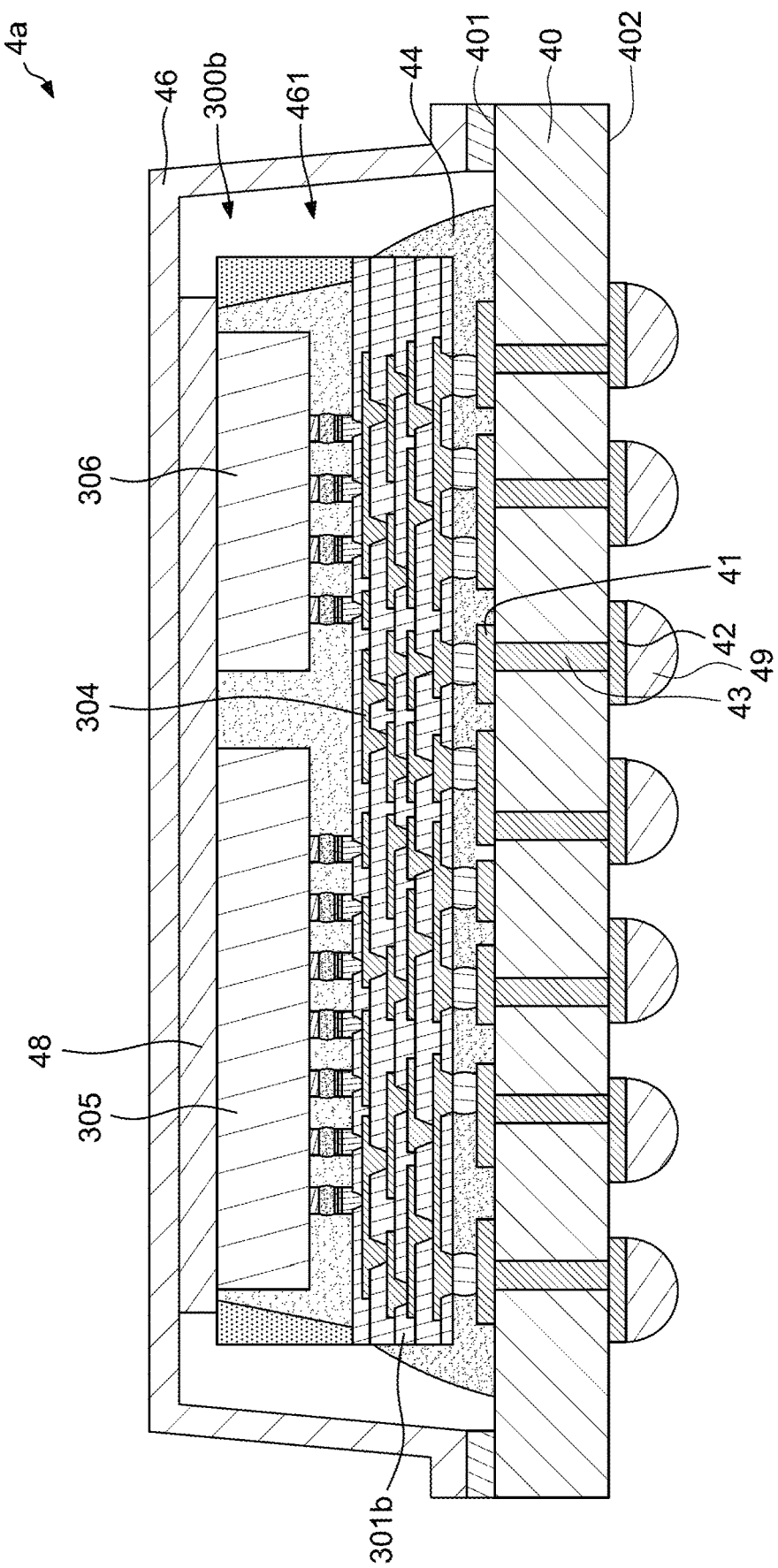
FIG. 10 illustrates a schematic cross-sectional view of an assembly structure according to some embodiments of the present disclosure.

FIG. 10 illustrates a schematic cross-sectional view of an assembly structure 4a according to some embodiments of the present disclosure. The assembly structure 4a is similar to the assembly structure 4 of FIG. 9F, except that the wiring structure 301b of the package structure 300b of the assembly structure 4a includes five dielectric layers 102 and four circuit layers.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for the purpose of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a wiring structure including a plurality of interconnection traces;
   a first electronic device and a second electronic device disposed on the wiring structure, and electrically connected to each other through the interconnection traces; and
   at least one dummy trace adjacent to the interconnection traces, wherein a mechanical strength of the at least one dummy trace is less than a mechanical strength of one of the interconnection traces,
   wherein the wiring structure includes a plurality of circuit layers, a topmost circuit layer is nearest to the first electronic device or the second electronic device, wherein the interconnection traces are disposed at the topmost circuit layer, and the at least one dummy trace is disposed above the interconnection traces.

2. The package structure of claim 1, wherein the at least one dummy trace includes a first portion and a second portion, and a width of the second portion is greater than a width of the first portion.

3. The package structure of claim 1, wherein the at least one dummy trace includes a neck-shape portion.

4. The package structure of claim 1, wherein the at least one dummy trace defines a through hole from a top view.

5. The package structure of claim 1, wherein the at least one dummy trace includes two dummy traces substantially perpendicular to each other.

6. The package structure of claim 1, wherein the wiring structure includes a plurality of circuit layers, a topmost circuit layer is nearest to the first electronic device or the second electronic device, wherein the at least one dummy trace is disposed at the topmost circuit layer.

7. The package structure of claim 1, wherein the at least one dummy trace defines at least one V-shaped notch.

8. The package structure of claim 7, wherein an end portion of the V-shaped notch includes a curved shape.

9. The package structure of claim 1, wherein a longitudinal axis of the at least one dummy trace is substantially parallel to a longitudinal axis of the interconnection trace.

10. A package structure, comprising:
    a wiring structure including a plurality of interconnection traces;
    a first electronic device and a second electronic device disposed on the wiring structure, and electrically connected to each other through the interconnection traces; and
    at least one dummy trace adjacent to the interconnection traces, wherein a mechanical strength of the at least one dummy trace is less than a mechanical strength of one of the interconnection traces,
    wherein the at least one dummy trace includes a first dummy trace, a second dummy trace and a third dummy trace, the first dummy trace and the second dummy trace are substantially perpendicular to each other, and the third dummy trace is not parallel with first dummy trace and the second dummy trace.

11. A package structure, comprising:
    a wiring structure including a plurality of interconnection traces;
    a first electronic device and a second electronic device disposed on the wiring structure, and electrically connected to each other through the interconnection traces; and
    at least one dummy trace adjacent to the interconnection traces, wherein a mechanical strength of the at least one dummy trace is less than a mechanical strength of one of the interconnection traces,
    wherein the at least one dummy trace includes a first dummy trace, a second dummy trace and a third dummy trace, an inclination angle between the first dummy trace and the third dummy trace is substantially 45 degrees, and an inclination angle between the second dummy trace and the third dummy trace is substantially 45 degrees.

12. A package structure, comprising:
    a wiring structure including a plurality of interconnection traces;
    a first electronic device and a second electronic device disposed on the wiring structure, and electrically connected to each other through the interconnection traces;
    at least one dummy trace adjacent to the interconnection traces, wherein a mechanical strength of the at least one dummy trace is less than a mechanical strength of one of the interconnection traces;
    an underfill material between the first electronic device and/or the second electronic device and the wiring structure; and
    a conductive via extending through the underfill material and electrically connected to the at least one dummy trace.

13. A package structure, comprising:
    a wiring structure including a plurality of interconnection traces;
    a first electronic device and a second electronic device disposed on the wiring structure, and electrically connected to each other through the interconnection traces; and
    at least one dummy trace adjacent to the interconnection traces, wherein a mechanical strength of the at least one dummy trace is less than a mechanical strength of one of the interconnection traces, wherein the at least one dummy trace includes a structurally weak portion, wherein the structurally weak portion overlaps with a projection of an edge of the first electronic device on the wiring structure or a projection of an edge of the second electronic device on the wiring structure.

14. A circuit layer structure, comprising:

a wiring structure including a plurality of interconnection traces; and at least one dummy trace disposed adjacent to the interconnection traces, wherein a mechanical strength of a first portion of the at least one dummy trace is less than a mechanical strength of a second portion of the at least one dummy trace, wherein the at least one dummy trace includes a first dummy trace, a second dummy trace and a third dummy trace, the first dummy trace and the second dummy trace are substantially perpendicular to each other, and the third dummy trace is not parallel with first dummy trace and the second dummy trace.

15. The circuit layer structure of claim 14, wherein a thickness of the second portion of the at least one dummy trace is greater than a thickness of the first portion of the at least one dummy trace.

16. The circuit layer structure of claim 14, wherein at least one dummy trace defines at least one notch.

17. The circuit layer structure of claim 14, wherein a tensile strength of the at least one dummy trace is less than a tensile strength of one of the interconnection traces.

* * * * *